(12) United States Patent
Koyama et al.

(10) Patent No.: US 7,906,784 B2
(45) Date of Patent: Mar. 15, 2011

(54) SEMICONDUCTOR DEVICE AND METHOD FOR MANUFACTURING THE SAME

(75) Inventors: Jun Koyama, Sagamihara (JP); Koji Dairiki, Isehara (JP); Susumu Okazaki, Nara (JP); Yoshitaka Moriya, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 54 days.

(21) Appl. No.: 12/421,840

(22) Filed: Apr. 10, 2009

(65) Prior Publication Data

US 2009/0194771 A1 Aug. 6, 2009

Related U.S. Application Data

(63) Continuation of application No. 11/354,810, filed on Feb. 16, 2006, now Pat. No. 7,566,633.

(30) Foreign Application Priority Data

Feb. 25, 2005 (JP) .................................. 2005-051867

(51) Int. Cl.
*H01L 33/00* (2010.01)
(52) U.S. Cl. ..... 257/72; 257/368; 257/773; 257/E27.06; 438/149; 438/458
(58) Field of Classification Search .................... 257/72, 257/368, 773, E27.06, E23.141, E33.066; 438/458, 149
See application file for complete search history.

(56) References Cited

U.S. PATENT DOCUMENTS

| 6,372,608 | B1 * | 4/2002 | Shimoda et al. ............... 438/455 |
| 6,887,650 | B2 | 5/2005 | Shimoda et al. |
| 7,060,153 | B2 | 6/2006 | Yamazaki et al. |
| 7,091,070 | B2 | 8/2006 | Imai et al. |
| 7,122,445 | B2 | 10/2006 | Takayama et al. |

(Continued)

FOREIGN PATENT DOCUMENTS

EP 1193759 4/2002

(Continued)

OTHER PUBLICATIONS

"Sense of Crisis" is a Trigger. Ignited Evolution of a Sesame-Grain Sized Chip Technology Development is Entering Into the Second Phase, NIKKEI Electronics, Nov. 18, 2002, No. 835, pp. 67-76.

(Continued)

*Primary Examiner* — Thinh T Nguyen
(74) *Attorney, Agent, or Firm* — Eric J. Robinson; Robinson Intellectual Property Law Office, P.C.

(57) ABSTRACT

An object of the present invention is to provide a semiconductor device which has flexibility and resistance to a physical change such as bending and a method for manufacturing the semiconductor device. A semiconductor device of the present invention includes a plurality of transistors provided over a flexible substrate, each of which has a semiconductor film, a gate electrode provided over the semiconductor film with a gate insulating film therebetween, and an interlayer insulating film provided to cover the gate electrode, and a bending portion provided between the plurality of transistors, in which the bending portion is provided by filling an opening formed in the interlayer insulating film with a material having a lower elastic modulus, a material having a lower glass transition point, or a material having a higher plasticity than that of the interlayer insulating film.

20 Claims, 30 Drawing Sheets

U.S. PATENT DOCUMENTS

| | | |
|---|---|---|
| 7,271,076 B2 | 9/2007 | Yamazaki et al. |
| 2001/0053559 A1 | 12/2001 | Nagao et al. |
| 2002/0090765 A1* | 7/2002 | Yamazaki et al. ............ 438/149 |
| 2003/0032210 A1 | 2/2003 | Takayama et al. |

FOREIGN PATENT DOCUMENTS

| | | |
|---|---|---|
| JP | 2001-260580 | 9/2001 |
| JP | 2001-272923 | 10/2001 |
| JP | 2003-203898 | 7/2003 |
| WO | WO-03/010825 | 2/2003 |
| WO | WO-2005/057658 | 6/2005 |

OTHER PUBLICATIONS

International Search Report (Application No. PCT/JP2004/018978) Dated Mar. 15, 2005.

Written Opinion (Application No. PCT/JP2004/018978) Dated Mar. 15, 2005.

International Search Report (Application No. PCT/JP2005/001541) Dated Mar. 22, 2005.

Written Opinion (Application No. PCT/JP2005/001541) Dated Mar. 22, 2005.

* cited by examiner 170  171   176  180

159   180

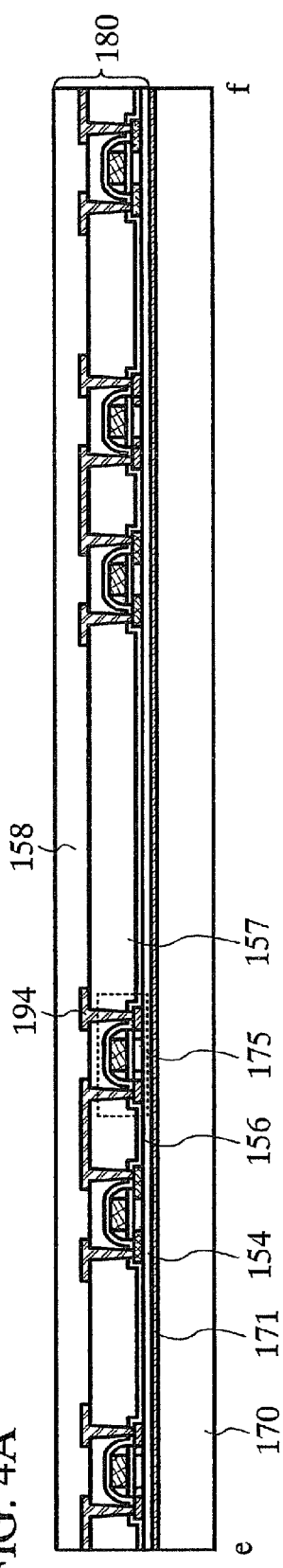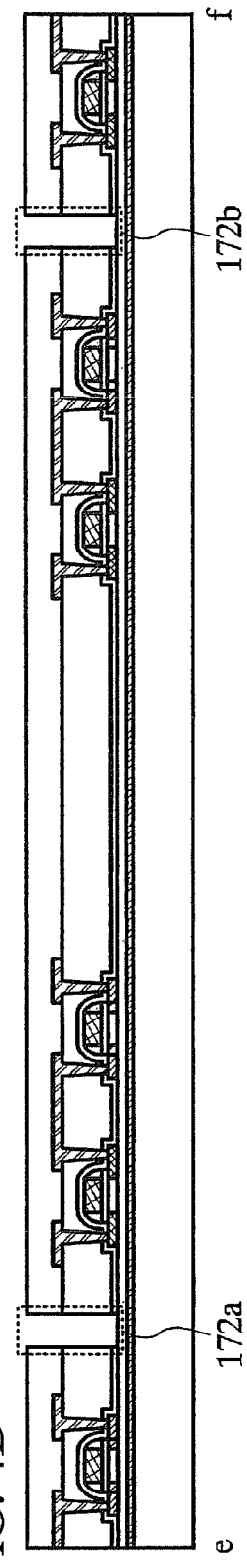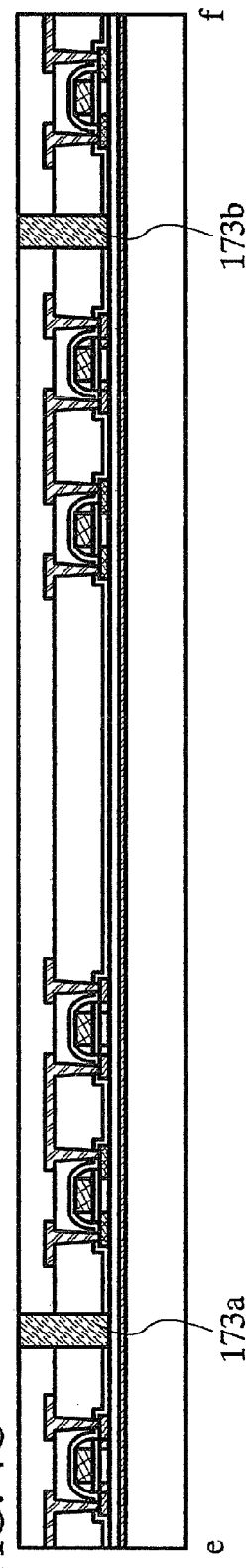

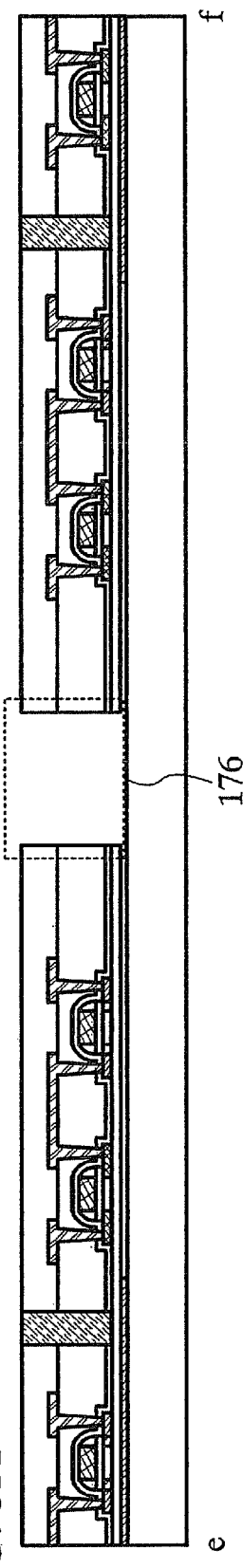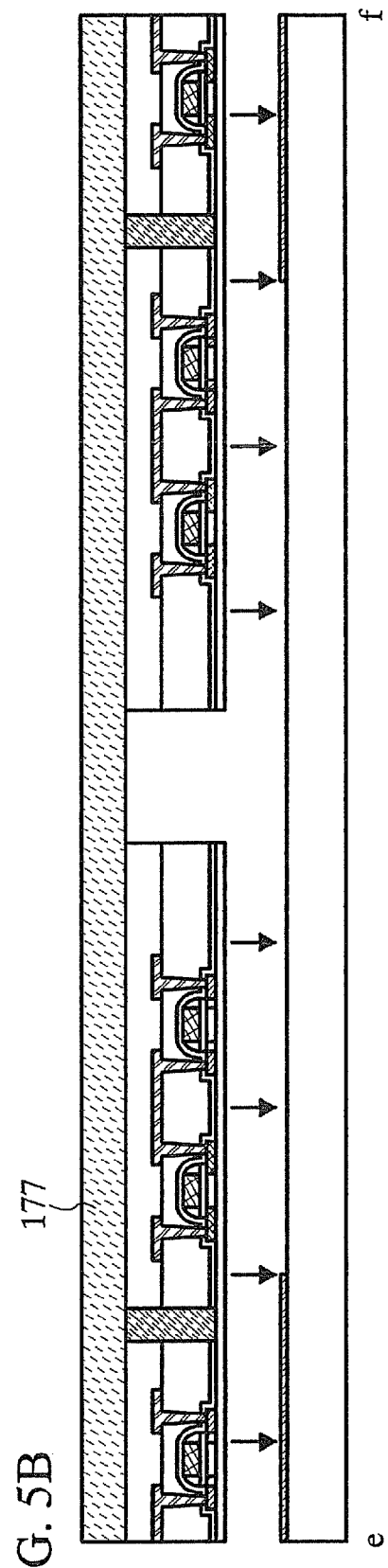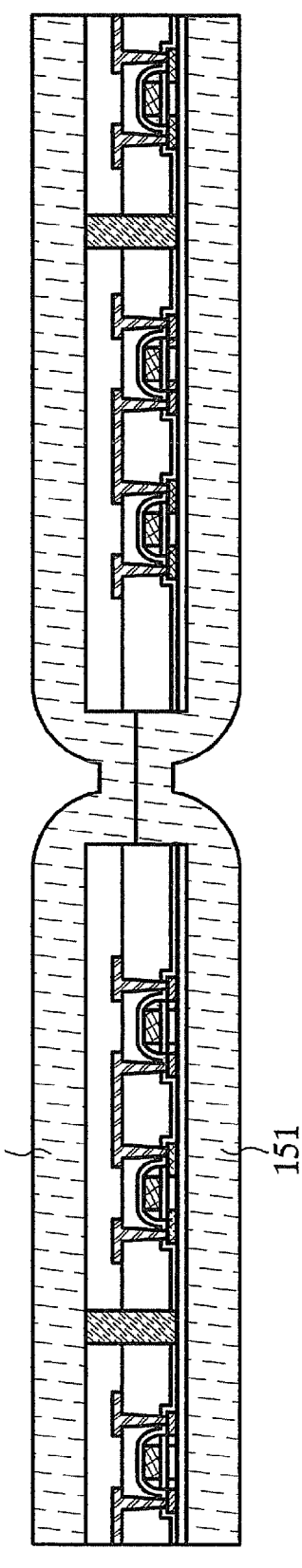
FIG. 5A
FIG. 5B
FIG. 5C

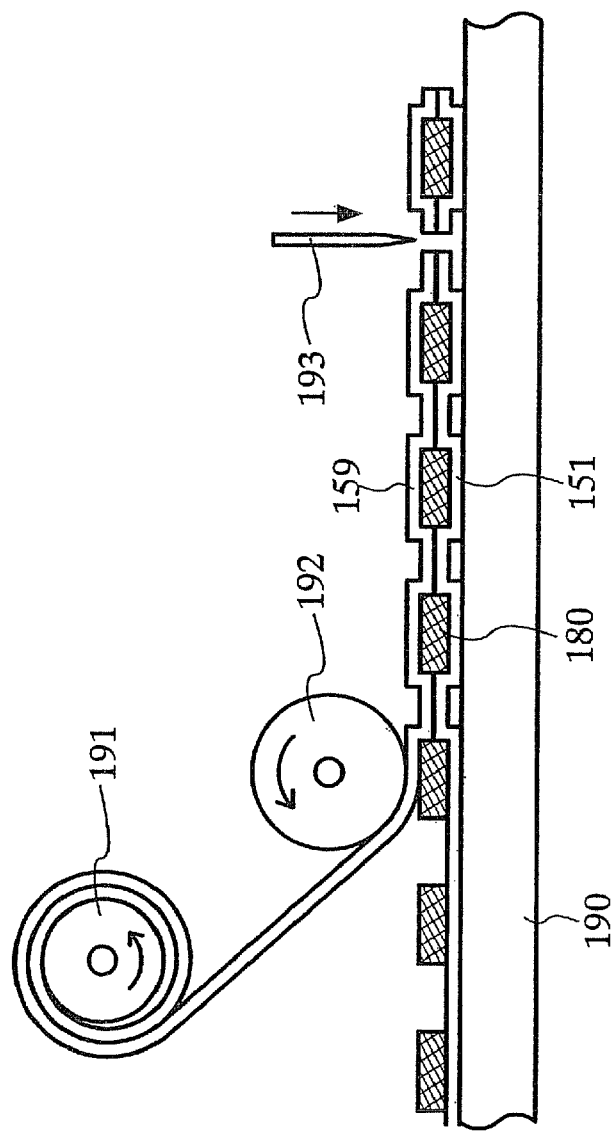
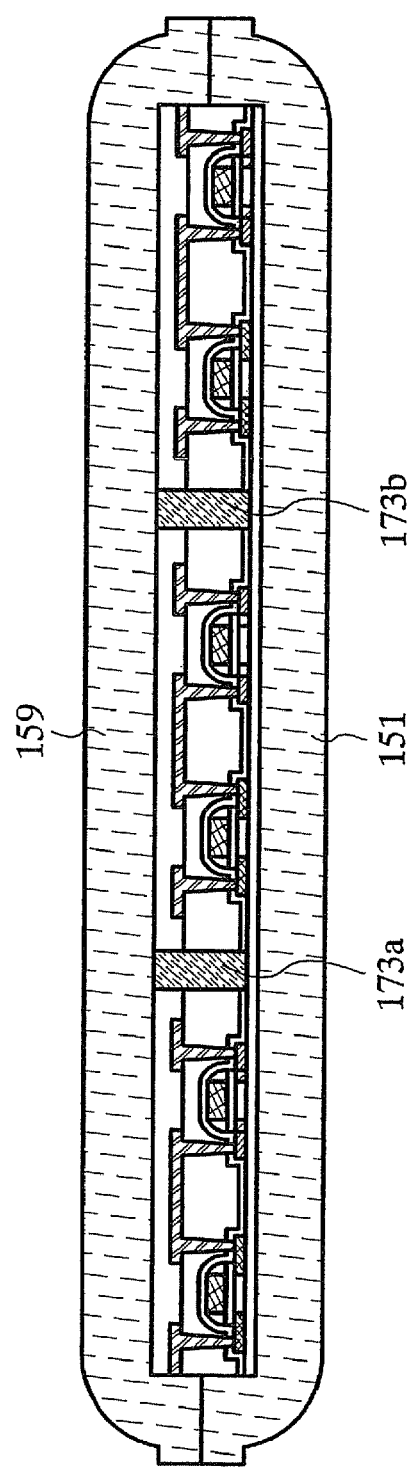
FIG. 6A
FIG. 6B

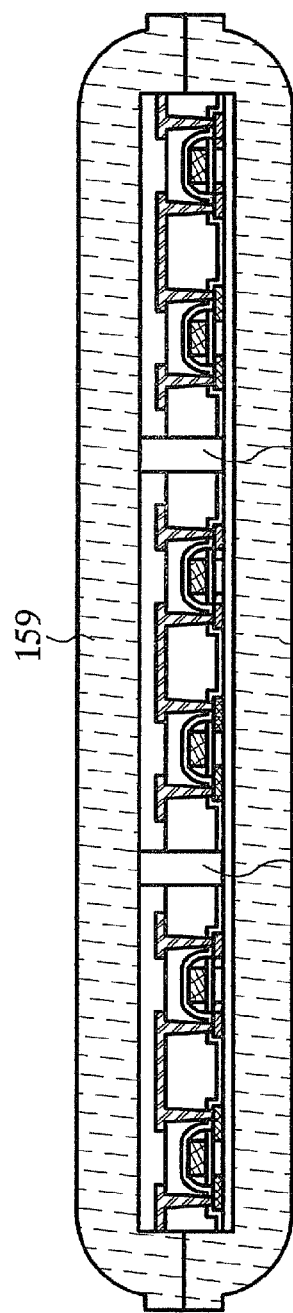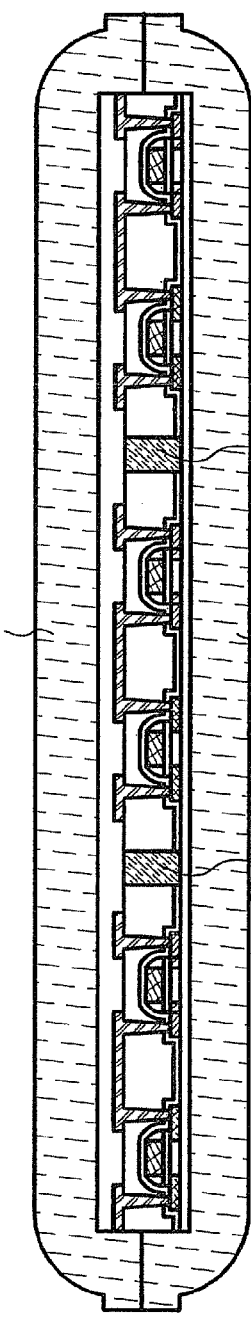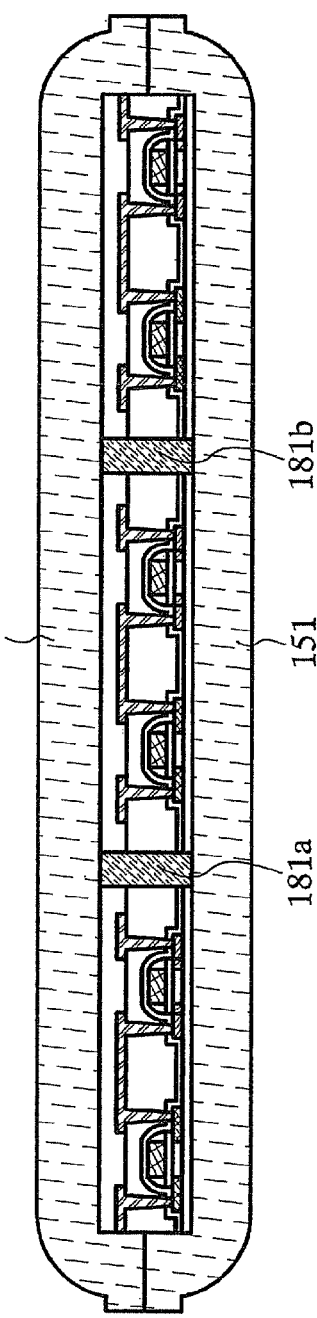

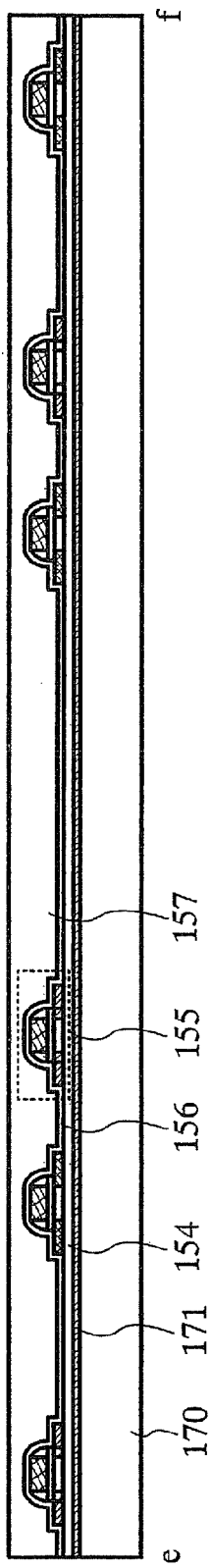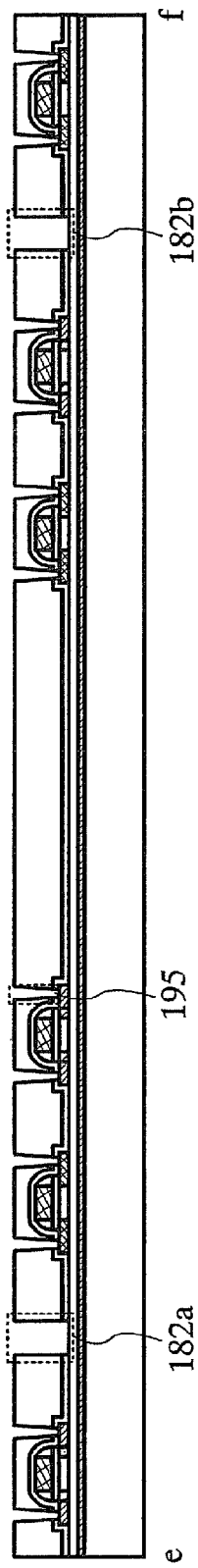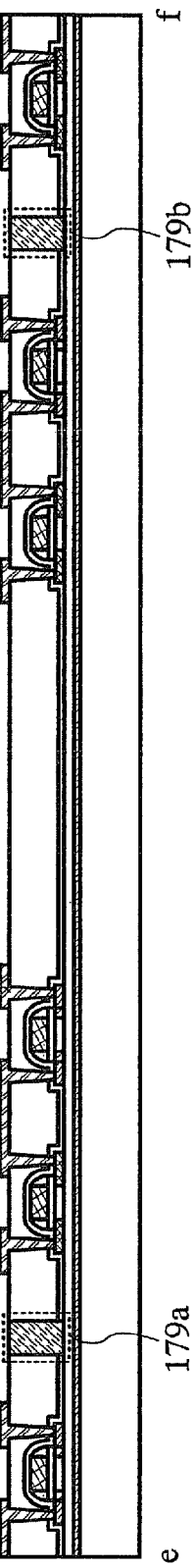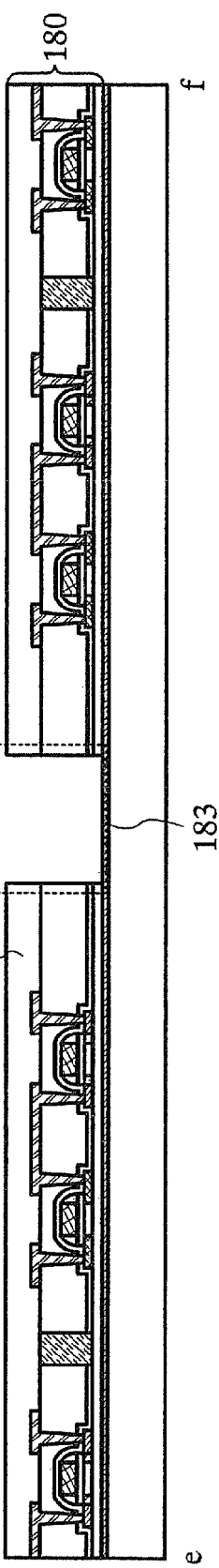

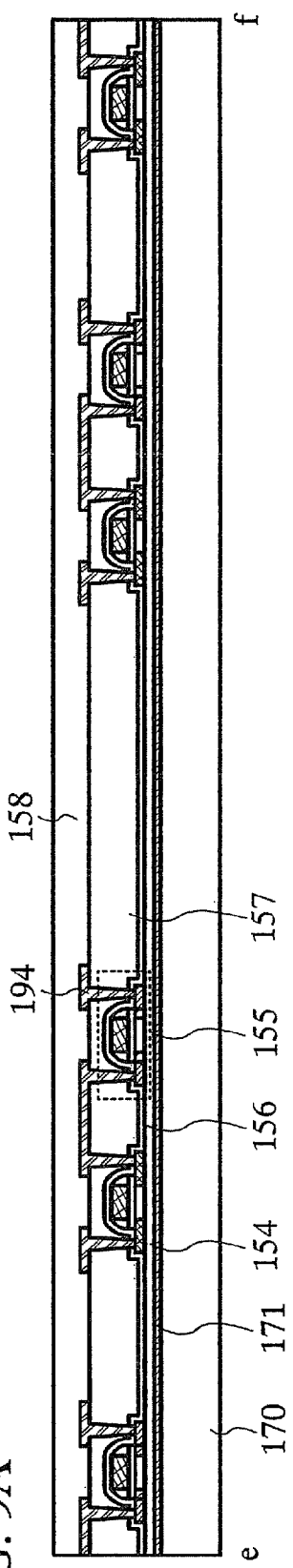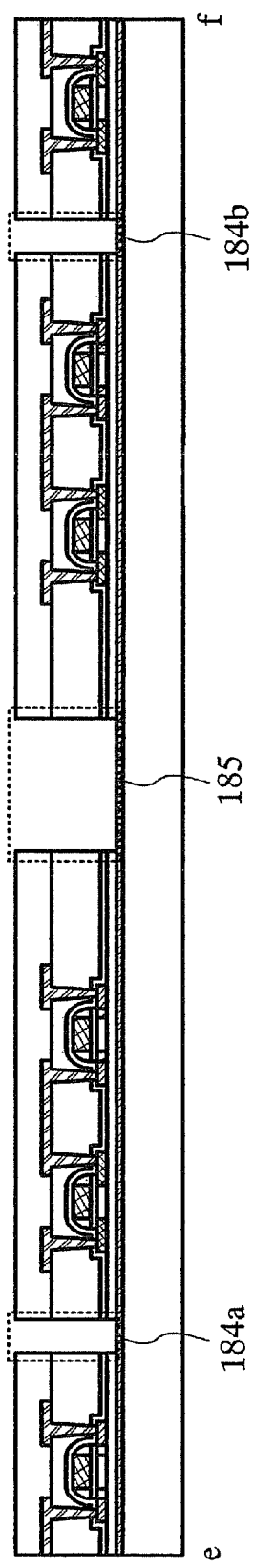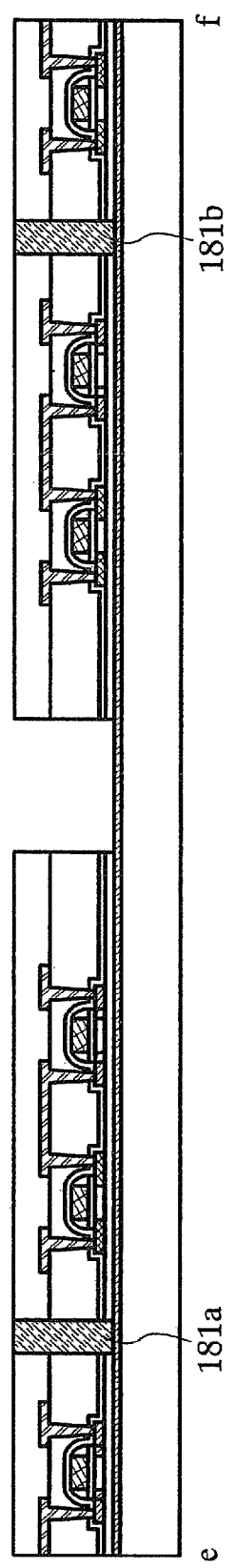

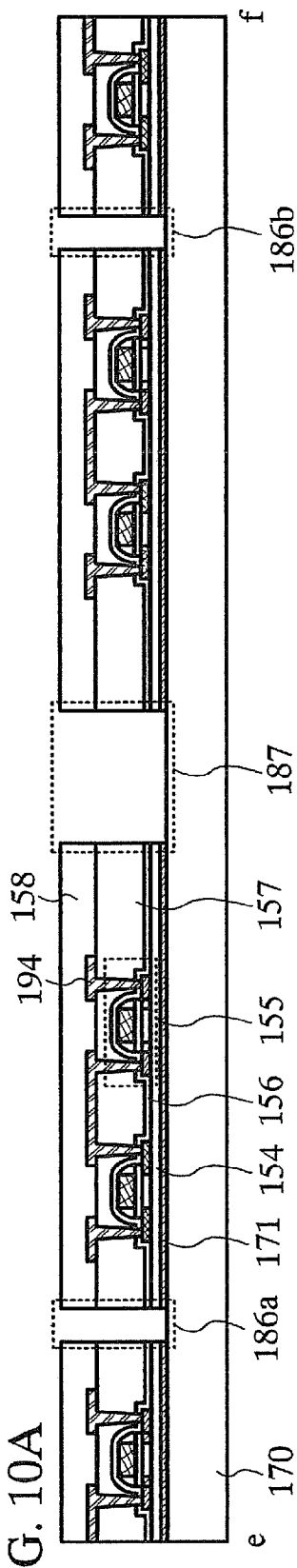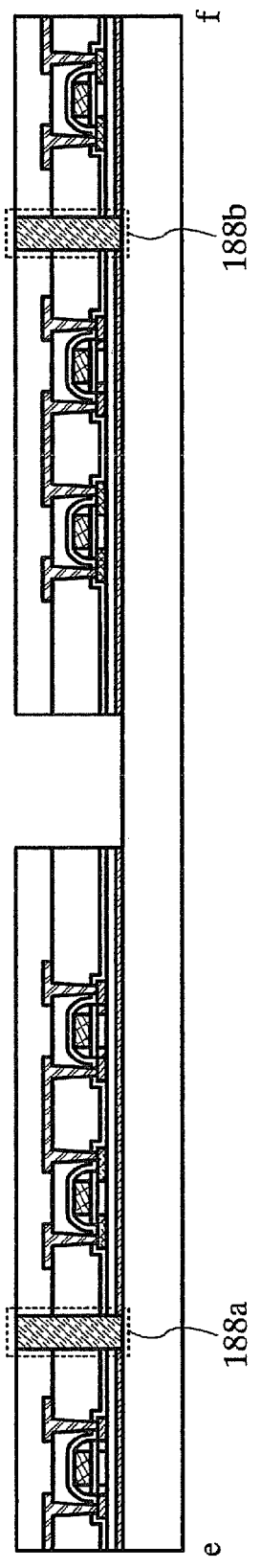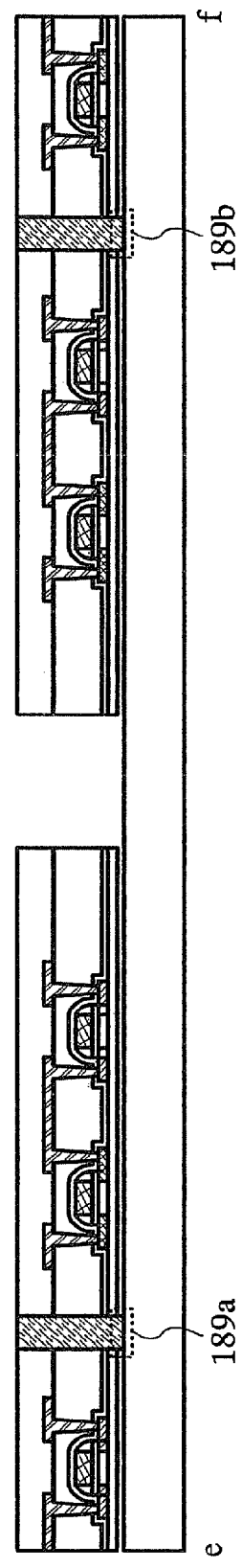

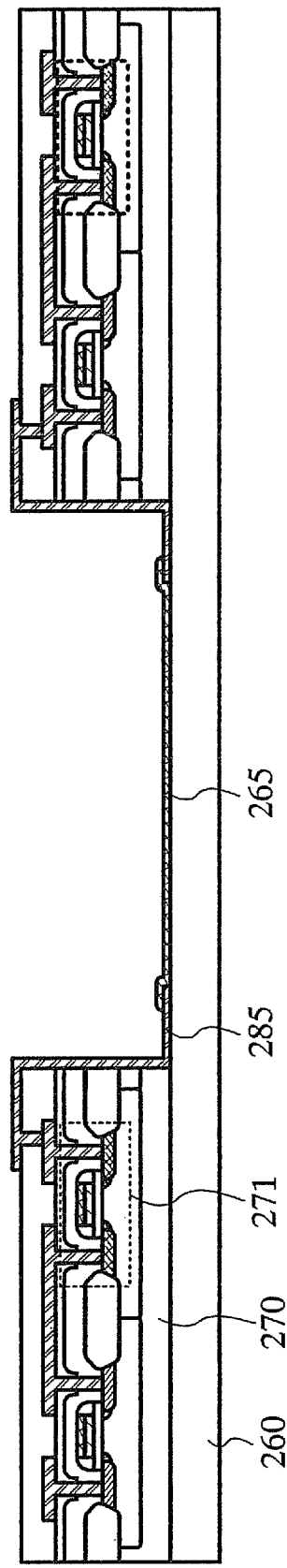
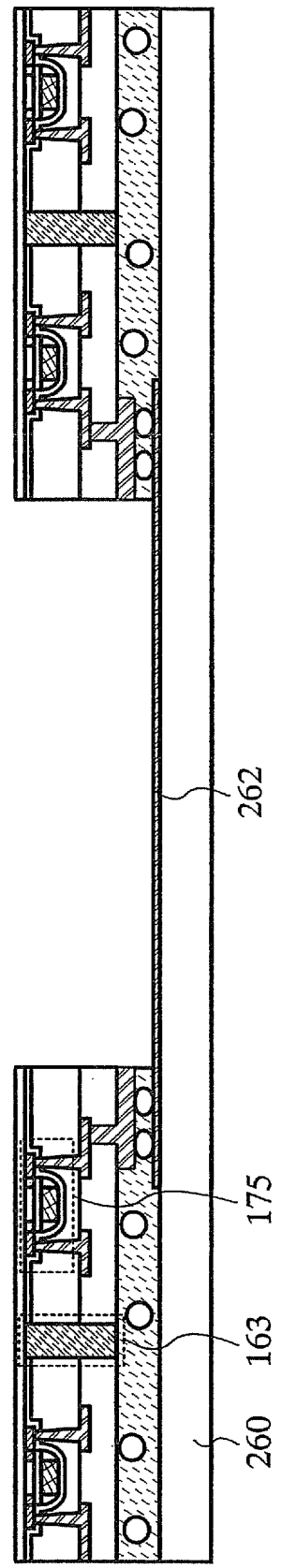
FIG. 18A
FIG. 18B

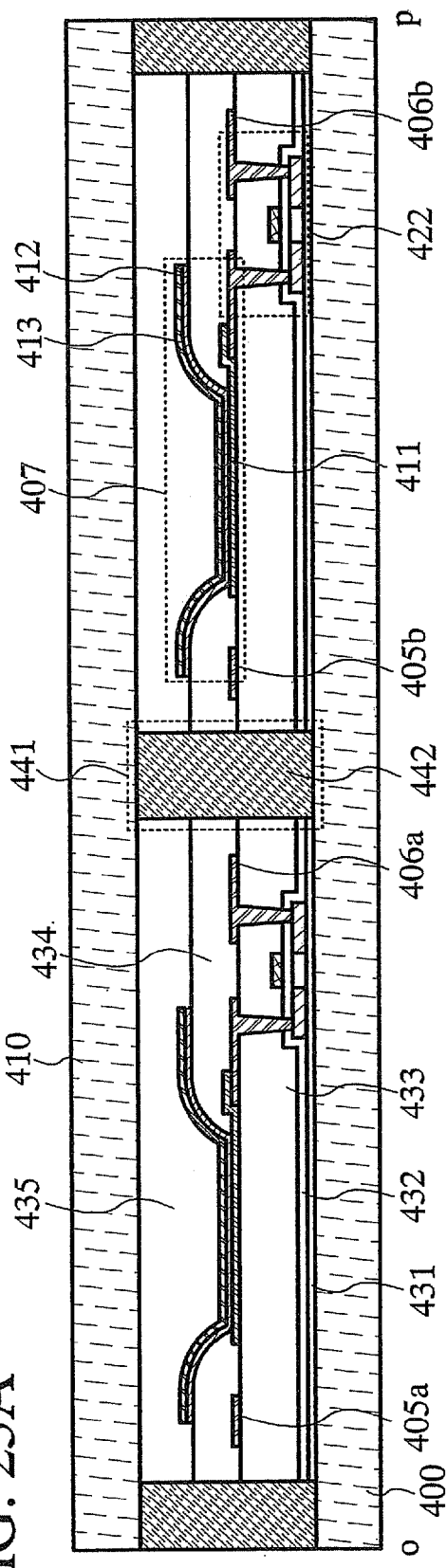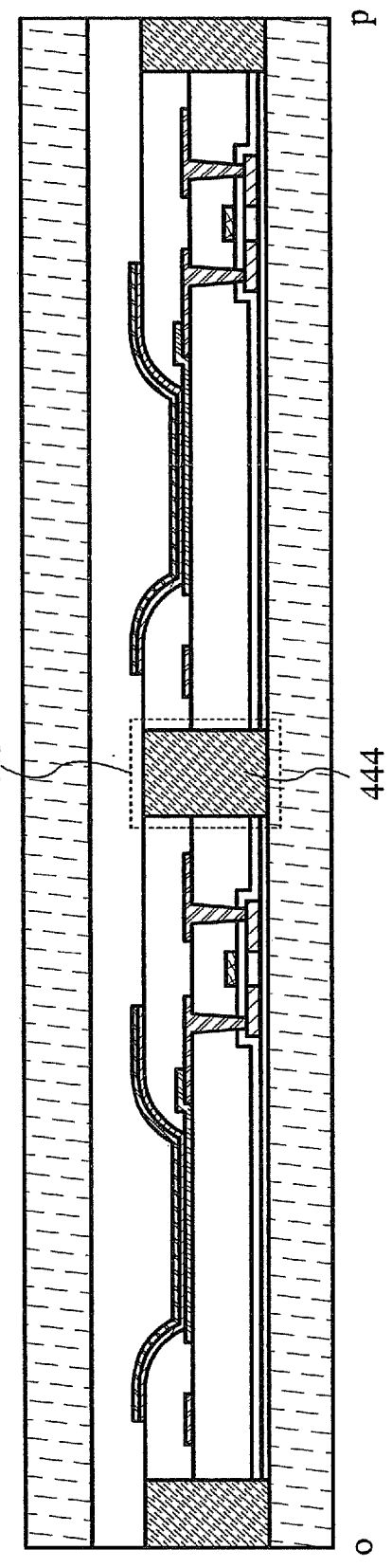

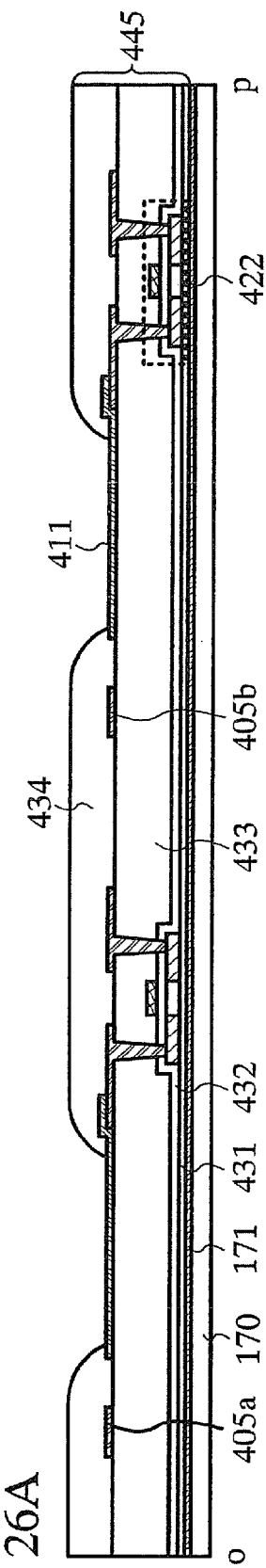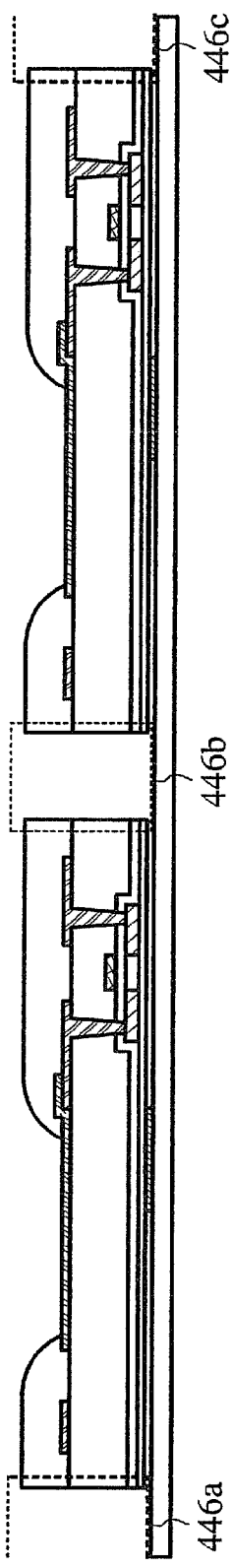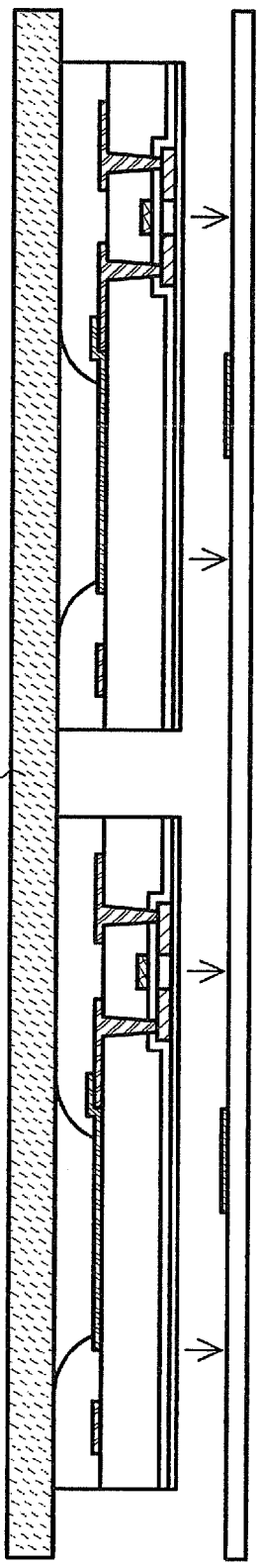

SEMICONDUCTOR DEVICE AND METHOD FOR MANUFACTURING THE SAME

BACKGROUND OF THE INVENTION

1. Field of the Invention

The present invention relates to a flexible semiconductor device and a method for manufacturing the semiconductor device.

2. Description of the Related Art

Recently, a technique to provide an integrated circuit including a transistor or the like over a flexible substrate such as a plastic substrate has attracted attention. A semiconductor device which is formed by providing an integrated circuit over a flexible substrate can achieve lighter weight, lower cost, or the like as compared to the case of using a substrate such as a semiconductor substrate or a glass substrate. Since a flexible semiconductor device can be bent, the flexible semiconductor device is expected to be applied to various fields and places.

However, when physical force (external force) such as bending is applied from outside to a semiconductor device which is formed by providing an integrated circuit that has an element such as a transistor over a flexible substrate, stress generated in the semiconductor device may damage the element such as a transistor which is included in the semiconductor device and affect characteristics of the element such as a transistor.

SUMMARY OF THE INVENTION

In view of the above problem, it is an object of the present invention to provide a semiconductor device which has flexibility and resistance to a physical change such as bending and a method for manufacturing the semiconductor device.

The present invention takes the following measures to achieve the above object.

One feature of a semiconductor device of the present invention is to include a plurality of transistors provided over a flexible substrate, each of which has a semiconductor film, a gate electrode provided over the semiconductor film with a gate insulating film therebetween, and an interlayer insulating film provided to cover the gate electrode, and a bending portion provided between the plurality of transistors. The bending portion can be provided by, for example, forming a space such as an opening in the interlayer insulating film. Note that the bending portion means a portion inside the semiconductor device where larger strain (change in shape or volume of an object) than in the other portion is selectively generated when physical force such as bending is applied to the semiconductor device.

Another feature of a semiconductor device of the present invention is to include a plurality of transistors provided over a flexible substrate, each of which has a semiconductor film, a gate electrode provided over the semiconductor film with a gate insulating film therebetween, and an interlayer insulating film provided to cover the gate electrode, and a bending portion provided between the plurality of transistors, in which the bending portion is provided by filling an opening formed in the interlayer insulating film with a material having a lower elastic modulus than that of the interlayer insulating film. In the present invention, a material having a lower glass transition point or higher plasticity than that of the interlayer insulating film can alternatively be provided as the material with which the opening is filled.

Further, in the above feature, a thin film transistor (TFT), a field effect transistor (FET) in which a channel region is provided in a single crystal semiconductor film, an organic transistor, or the like can be used as the transistor. In addition, the invention is not limited to the transistor. In the case where the semiconductor device includes an element such as a diode or a capacitor element, the bending portion can be provided between the elements.

One feature of a method for manufacturing a semiconductor device of the present invention is to include the steps of forming a separation layer over a first substrate, forming a first insulating film over the separation layer, forming a thin film transistor over the first insulating film, forming a second insulating film to cover the thin film transistor, forming a conductive film which is electrically connected to the thin film transistor over the second insulating film, forming a third insulating film to cover the second insulating film and the conductive film, selectively forming a first opening in the second insulating film and the third insulating film, providing the first opening with a material having a lower elastic modulus than those of the second insulating film and the third insulating film, exposing the separation layer by selectively forming a second opening in the first insulating film, the second insulating film, and the third insulating film, separating the separation layer and the first substrate from the first insulating film by attaching a film having an adhesive surface to a surface of the third insulating film, and fixing the first insulating film to a second substrate. In the above feature, the first opening can be provided with a material having a lower glass transition point or higher plasticity than those of the second insulating film and the third insulating film in place of the material having a lower elastic modulus than those of the second insulating film and the third insulating film.

Another feature of a method for manufacturing a semiconductor device of the present invention is to include the steps of providing a plurality of integrated circuits, each of which has a transistor, over a substrate where a conductive film pattern is formed, by attachment so as to be electrically connected to the conductive film pattern, forming an insulating film to cover the plurality of integrated circuits, and forming a depression in a portion of the insulating film which is located between the plurality of integrated circuits. Further, after forming the depression in the insulating film, the depression can be provided with a material having a lower elastic modulus than that of the insulating film, a material having a lower glass transition point than that of the insulating film, a material having higher plasticity than that of the insulating film, or the like.

Still another feature of a method for manufacturing a semiconductor device of the present invention is to include the steps of providing a plurality of integrated circuits, each of which has a transistor, over a substrate by attachment, forming a conductive film which electrically connects the plurality of integrated circuits, forming an insulating film to cover the plurality of integrated circuits, and forming a depression in a portion of the insulating film which is located between the plurality of integrated circuits. Further, after forming the depression in the insulating film, the depression can be provided with a material having a lower elastic modulus than that of the insulating film, a material having a lower glass transition point than that of the insulating film, a material having higher plasticity than that of the insulating film, or the like. The conductive film which electrically connects the integrated circuits can be formed using a droplet discharge method or a printing method such as a screen printing method. Note that the droplet discharge method is a method for forming a composition containing a conductive material, an insulating material, or the like in an arbitrary position by discharging a droplet (also referred to as a dot) of the composition, and is also referred to as an ink-jet method depending on its mode.

In the case of forming a semiconductor device having a plurality of integrated circuits which is provided over a flexible substrate, a bending portion is formed between the plurality of integrated circuits or between elements such as transistors included in the integrated circuits. Accordingly, even when external force such as bending is applied to the semiconductor device, the semiconductor device bends with strain selectively generated in the bending portion. Therefore, stress exerted on the element such as a transistor can be reduced, and a damage rate of the element such as a transistor can be decreased. In addition, characteristics of the element such as a transistor can be prevented from being affected. Further, the semiconductor device can be bent with less force by selectively providing a bending portion inside the semiconductor device.

BRIEF DESCRIPTION OF DRAWINGS

FIGS. 4A to 4C show an example of a method for manufacturing a semiconductor device of the present invention.

FIGS. 5A to 5C show an example of a method for manufacturing a semiconductor device of the present invention.

FIGS. 6A and 6B show an example of a method for manufacturing a semiconductor device of the present invention.

FIGS. 7A to 7C show examples of a semiconductor device of the present invention.

FIGS. 8A to 8D show an example of a method for manufacturing a semiconductor device of the present invention.

FIGS. 9A to 9C show an example of a method for manufacturing a semiconductor device of the present invention.

FIGS. 10A to 10C show an example of a method for manufacturing a semiconductor device of the present invention.

FIGS. 18A and 18B show examples of a semiconductor device of the present invention.

FIGS. 25A and 25B show examples of applying a semiconductor device of the present invention to a display device.

FIGS. 26A to 26C show an example of a method for manufacturing a semiconductor device of the present invention.

DETAILED DESCRIPTION OF THE INVENTION

Figure 1A:
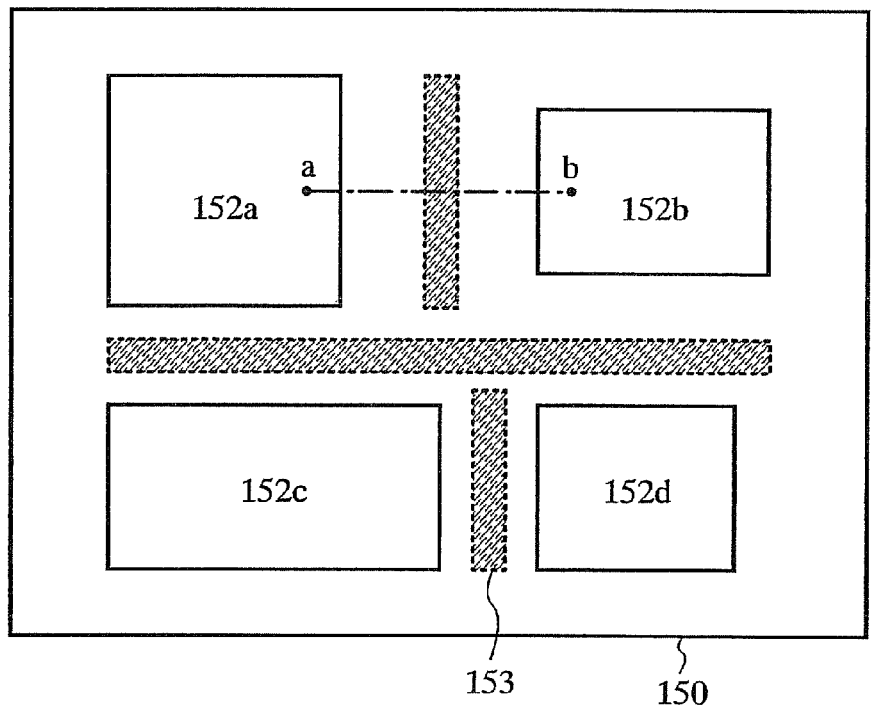
FIGS. 1A to 1C show an example of a semiconductor device of the present invention.

Embodiment modes of the present invention are hereinafter explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment modes. Note that the same reference numeral is used among different drawings to denote the same component in the structure of the present invention described below.

Embodiment Mode 1

In this embodiment mode, one structure example of a semiconductor device of the present invention is explained with reference to drawings.

Generally, a change in shape or volume of an object (also referred to as "strain") is generated by applying stress to the object. When stress is applied by physical force such as bending to a semiconductor device having an integrated circuit provided over a flexible substrate, the element such as a transistor included in the integrated circuit may be damaged with strain generated, and characteristics of the element such as a transistor may be affected. Therefore, in a semiconductor device 150 which is described in this embodiment mode, a bending portion 153 is provided between integrated circuits 152a to 152d which are provided over a flexible substrate such as a plastic substrate (FIG. 1A). The bending portion 153 may be provided in any manner as long as it is provided between the integrated circuits 152a to 152d. For example, the bending portion may be continuously provided between the integrated circuits 152a and 152b and the integrated circuits 152c and 152d, or may be partially provided between the integrated circuit 152a and the integrated circuit 152b or between the integrated circuit 152c and the integrated circuit 152d.

Note that the bending portion means a portion inside the semiconductor device where larger strain (change in shape or volume of an object) than in the other portion is selectively generated when physical force such as bending is applied to the semiconductor device. For example, if a semiconductor device provided with a bending portion in a certain portion is bent, stress is generated inside the semiconductor device. Strain due to the stress is selectively generated in the bending portion, and the semiconductor device is bent by bending of the bending portion. In addition, by selectively providing the bending portion inside the semiconductor device, large strain is selectively generated in the bending portion. Therefore, it becomes possible to bend the semiconductor device so as to have a smaller curvature radius with less force as compared to the case of not providing the bending portion. Accordingly, stress which is applied to an element such as a transistor or the like provided in the integrated circuit can be reduced, and the element such as a transistor can be prevented from being damaged.

The bending portion 153 is provided by forming a material which is bent more easily than that in the other portion. Note that the material provided in the bending portion may be referred to as a bending material in this specification sometimes for convenience.

The material provided in the bending portion may be a material having a property of being bent more easily than a material provided in a portion other than the bending portion. For example, a material exhibiting elasticity or a material having plasticity can be used. Note that in the case of using a material exhibiting elasticity, the material provided in the bending portion is set to have a lower elastic modulus (ratio of stress to strain) than that of a material provided in the other portion. In the case of using a material having plasticity, the material provided in the bending portion is preferable set to have higher plasticity than that of a material provided in the other portion. Note that the elasticity here means a property of an object whose shape or volume is changed by external force to return to its original condition after the force is removed. In addition, the plasticity here means a property of being easily deformed by external force and kept strained even after removing the force.

As the material exhibiting elasticity, a material having a high elastic limit is preferable. For example, a material having a property of being significantly deformed if force is applied and returning to its original shape after the force is removed, like rubber, can be used. Specifically, a high molecular weight compound exhibiting rubber elasticity or the like can be given. Alternatively, a high molecular weight compound exhibiting viscosity as well as elasticity (viscoelasticity) can be used.

As the material having plasticity, an insulating material such as a high molecular weight compound having a property of being easily deformed by external force and kept strained even after removing the force can be used. Alternatively, metal such as Au, Ag, Al, or Cu or the like exhibiting ductility or malleability can be used. Accordingly, in the case of providing the material having plasticity in the bending portion in the invention, when the semiconductor device is curved by applying physical force, the semiconductor device can be kept curved even after removing the physical force.

Further, in the case of providing a high molecular weight organic compound or the like having a glass transition temperature in the bending portion, the material provided in the bending portion is set to have a lower glass transition point than that of a material provided in the other portion. A material having a low glass transition point has higher viscoelasticity than that of a material having a high glass transition point. Therefore, in the case where the material having a low glass transition and the material having a high glass transition are provided, large strain is selectively generated in the material having a low glass transition point when stress is applied. In this manner, the same material can be provided in the bending portion and the other region by changing a glass transition point.

Further, the material provided in the bending portion may be set to have lower hardness than that of the material provided in the other region, or a protective film using a material with high hardness may be provided above a region including a transistor or the like, which is preferably not bent. Note that hardness of a material may be evaluated by a Vickers hardness test or the like.

Since large strain is selectively generated in the bending portion when stress is applied, a material having high bending resistance is preferably provided in the bending portion. In the case of using an elastic body, a material having a high elastic limit is preferably used. By using the material having high bending resistance, resistance of the semiconductor device can be improved.

Figure 1B:
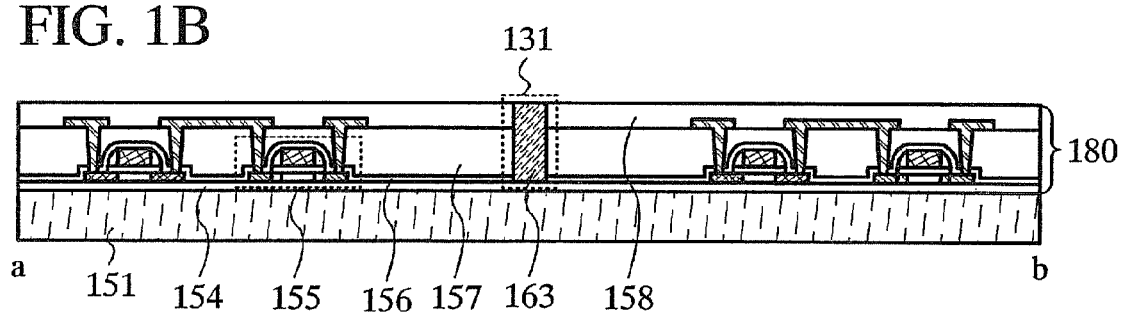

Subsequently, a schematic diagram of a cross-sectional structure along line a-b in FIG. 1A is shown in FIG. 1B.

In FIG. 1B, the semiconductor device 150 has the integrated circuits 152*a* to 152*d* which are provided over a flexible substrate 151. Here, the case where the integrated circuits 152*a* to 152*d* have an element formation layer 180 including insulating films 154 and 156 to 158, a transistor 155, and a bending material 163 is shown. More specifically, the transistor 155 is provided over the flexible substrate 151 with the insulating film 154 therebetween, the insulating films 156 to 158 are provided to cover the transistor 155, and the bending material 163 is provided in an opening 131 which is formed in the insulating films 156 to 158.

As the substrate 151, a flexible film-like substrate or the like can be used. For example, a film formed of polypropylene, polyester, vinyl, polyvinyl fluoride, vinyl chloride, or the like, paper formed of a fibrous material, a laminated film of a base material film (such as a polyester film, a polyamide film, an inorganic evaporated film, or paper) and an adhesive synthetic resin film (such as an acrylic synthetic resin film or an epoxy synthetic resin film), or the like can be used. Alternatively, a flexible metal substrate may be used. For example, a stainless-steel substrate or the like can be used.

The integrated circuits 152*a* to 152*d* have an element such as a transistor or a diode. For example, various diodes such as a variable capacitance diode, a Schottky diode, or a tunnel diode can be employed as the diode. In the invention, all kinds of integrated circuits such as a CPU, a memory, or a microprocessor can be provided using the above transistor, diode, or the like.

The insulating film 154 can be provided to have a single-layer structure of an insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or a laminated structure thereof. In the case of providing the insulating film 154 to have a two-layer structure, for example, a silicon nitride oxide film may be provided as a first insulating film, and a silicon oxynitride film may be provided as a second insulating film. Further, in the case of providing the insulating film 154 to have a three-layer structure instead of the two-layer structure, a silicon oxynitride film may be provided as a first insulating film, a silicon nitride oxide film may be provided as a second insulating film, and a silicon oxynitride film may be provided as a third insulating film.

The insulating film 156 can be provided by a sputtering method, a plasma CVD method, or the like to have a single-layer structure of an insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or a film containing carbon such as a DLC (diamond like carbon) film or a laminated structure thereof.

The insulating films 157 and 158 can be provided to have a single-layer structure of an organic material such as epoxy, polyimide, polyamide, polyvinylphenol, benzocyclobutene, or acrylic, a siloxane-based material, or the like as well as the above-described insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or the film containing carbon such as a DLC (diamond like carbon) film or a laminated structure thereof.

As the transistor 155, for example, a thin film transistor (TFT) may be provided; a field effect transistor (FET) which is formed on a semiconductor substrate of Si or the like using the substrate as a channel may be provided, or an organic TFT whose channel region is formed of an organic compound material may be provided. All kinds of integrated circuits such as a CPU, a memory, or a microprocessor can be provided using the transistor 155. Here, the case of providing, as the transistor 155, a thin film transistor having a CMOS circuit which is a combination of an n-channel semiconductor and a p-channel semiconductor is described. Further, an impurity region (including a source region, a drain region, and an LDD region) is formed in a semiconductor film, and an insulating film (sidewall) is provided to be in contact with a side face of a gate electrode. Although the case of forming an LDD region in an n-channel semiconductor film and not in a p-channel semiconductor film is described, an LDD region can naturally be formed also in the p-channel semiconductor film as in the n-channel semiconductor film. In addition, the transistor may have a structure in which either or both the source and drain regions and the gate electrode are provided with a silicide layer of nickel, molybdenum, cobalt, or the like. In the case of providing a thin film transistor or an organic TFT, a semiconductor film is formed in an island shape. Therefore, even when external force such bending is applied to the semiconductor device, stress which is applied to the semiconductor film can be reduced, and the semiconductor film can be prevented from being damaged.

As the bending material 163, a material which is bent more easily than a lamination body of the insulating films 157 and 158 or a lamination body of the insulating films 156 to 158 is provided here. For example, an organic material such as polyethylene, vinyl acetate, ethylene vinyl acetate, polystyrene, polyurethane, polypropylene, polyvinyl fluoride, vinyl chloride, polyester, polyamide, or polyimide; metal which exhibits high ductility and malleability such as Au, Ag, Cu, or Al; or the like can be used. In the case of using the above material, the material is set to have a lower elastic modulus than that of a material used for the insulating film 156, the insulating film 157, and the insulating film 158. In the case of using a high molecular weight compound as the bending material 163, the compound is set to have a lower glass transition point than that of the material used for at least one of the insulating film 156, the insulating film 157, and the insulating film 158. The material used as the bending material 163 may be the same as that used for at least one of the insulating films 156 to 158. In this case, the material used for at least one of the insulating films 156 to 158 and the material used for the bending material 163 are set to have different glass transition points, and the material used as the bending material 163 is set to have a lower glass transition point than that of the material used for at least one of the insulating films 156 to 158. In the case of using an organic material for the insulating film 156, 157, or 158, for example, the organic material used for the insulating film 156, 157, or 158 can be set to have a higher glass transition point than room temperature, and an organic material used as the bending material 163 can be set to have a lower glass transition point than room temperature.

Figure 1C:
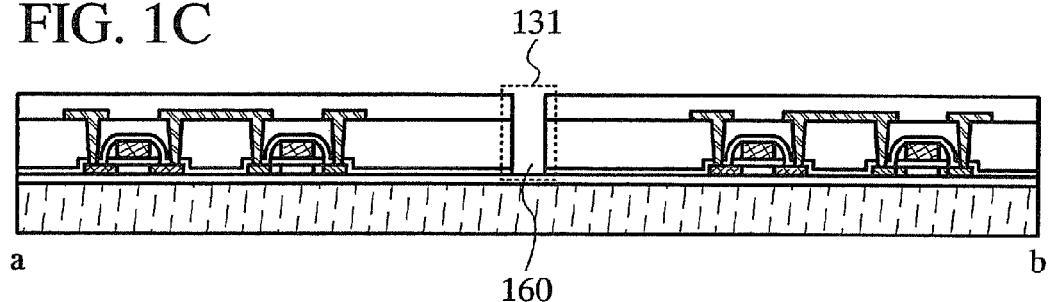

Note that FIG. 1B shows an example of providing the bending portion 153 by filling the opening 131 formed in the insulating films 156 to 158 with the bending material 163. However, the bending portion 153 can also be provided by making a cut in the insulating film 156, 157, or 158 or leaving the opening 160 as a space without providing anything, instead of providing the bending material 163 (FIG. 1C). Thus, by providing a cut or a space partially or fully in the lamination body of the insulating films 156 to 158, stress can be concentrated in the cut or space when stress is applied to the semiconductor device, and stress which is applied to a transistor or the like can be reduced.

Note that, although FIGS. 1A to 1C show a structure in which the bending portion 153 is provided between the integrated circuits 152a to 152d having various functions such as a CPU or a memory which are provided over the substrate 151, the invention is not limited thereto. The bending portion may be provided anywhere other than in a portion to which stress is preferably prevented from being applied. For example, the bending portion can be provided within a region of the integrated circuits 152a to 152d. An example of this case is shown in FIGS. 2A to 2C.

Figure 2A:
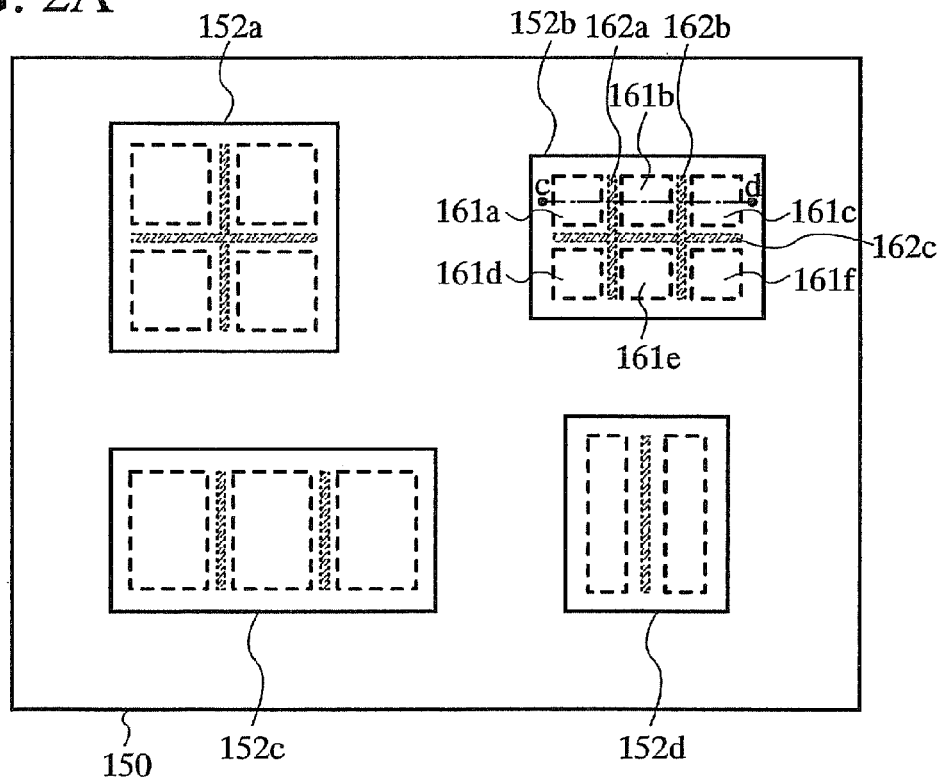
FIGS. 2A to 2C show an example of a semiconductor device of the present invention.

FIG. 2A shows the case where each of the integrated circuits 152a to 152d is divided into a plurality of blocks and the bending portion is provided between the blocks. More specifically, taking the integrated circuit 152b as an example, the integrated circuit 152b is divided into six regions of blocks 161a to 161f, and bending portions 162a, 162b, 162c, or the like where strain is selectively generated when stress is applied are provided between the blocks. The bending portions 162a to 162c provided between the blocks are provided to avoid a transistor.

Figure 2B:
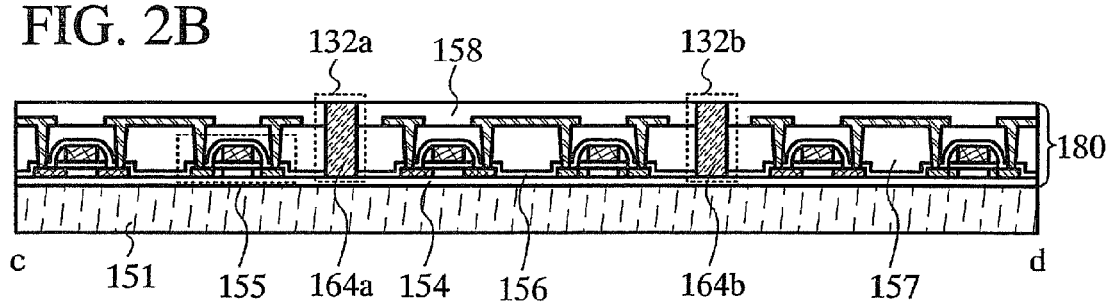
Figure 2C:
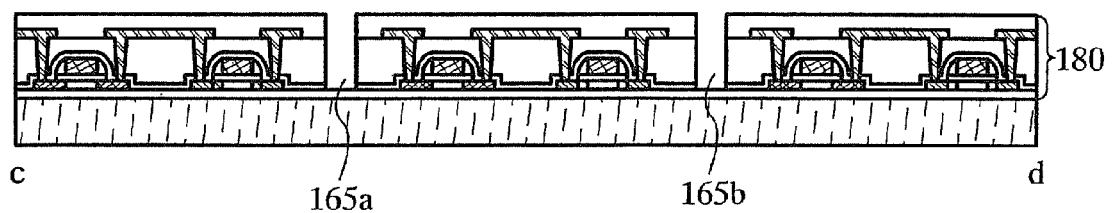

A schematic diagram of a cross-sectional structure along line c-d in FIG. 2A is shown in FIG. 2B.

A transistor 155 which is included in each region of the blocks 161a to 161c is provided over a flexible substrate 151 with an insulating film 154 therebetween; insulating films 156 to 158 are provided to cover the transistor 155, and bending materials 164a and 164b are provided, respectively, in openings 132a and 132b which are formed in the insulating films 156 to 158. Further, the opening 132a is provided between the blocks 161a and 161b, and the opening 132b is provided between the blocks 161b and 161c.

As shown in FIG. 2C, a structure in which a cut is made in the insulating film 156, 157, or 158 or spaces 165a and 165b are provided without providing anything in the openings, instead of providing the bending materials 164a and 164b, is also possible.

Note that the bending portion can be provided between transistors.

By providing a bending portion in a semiconductor device as described above, the semiconductor device bends with strain selectively generated in the bending portion when the semiconductor device is bent. Therefore, damage or the like of an element such as a transistor provided in a region other than the bending portion can be prevented. In addition, when the semiconductor device is bent to have a certain curvature radius, the semiconductor device provided with the bending portion can be bent with less force than a semiconductor device which is not provided with the bending portion. Accordingly, stress which is applied to a transistor or the like can be reduced.

Embodiment Mode 2

In this embodiment mode, an example of a method for manufacturing a semiconductor device of the present invention is explained with reference to drawings.

This embodiment mode describes an example of manufacturing a semiconductor device by temporarily providing an element formation layer including an element such as a transistor over a rigid substrate such as a glass substrate, then separating the element formation layer from the rigid substrate using a separation method, and providing the element formation layer over a flexible substrate.

Figure 3A:
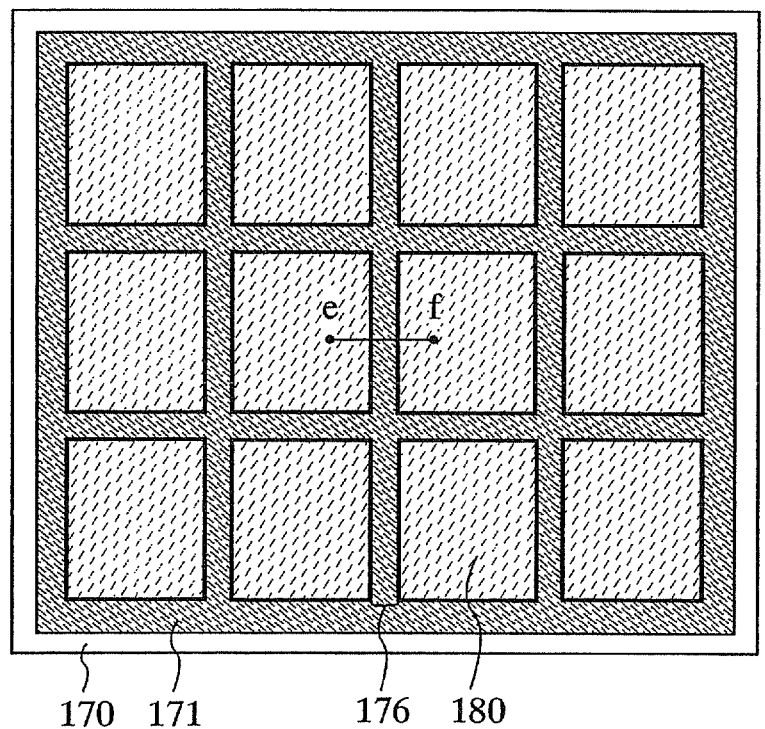
FIGS. 3A and 3B show an example of a method for manufacturing a semiconductor device of the present invention.

Here, an example of providing twelve element formation layers 180 over one substrate 170 with a separation layer 171 therebetween and then separating the element formation layers 180 from the substrate 170 is shown (FIG. 3A).

First, the separation layer 171 is formed over the substrate 170, and the element formation layer 180 including an insulating film 154, a thin film transistor (TFT) 175, an insulating film 156, an insulating film 157, a conductive film 194, and an insulating film 158 is formed over the separation layer 171 (FIG. 4A). Specifically, the thin film transistor 175 is formed over the separation layer 171 with the insulating film 154 therebetween; the insulating films 156 and 157 are formed to cover the thin film transistor; the conductive film 194 is formed over the insulating film 157 so as to be connected to an impurity region of the thin film transistor 175; and the insulating film 158 is formed to cover the conductive film 194. In addition, an insulating film may be formed as a base film between the substrate 170 and the separation layer 171. By providing the insulating film between the substrate 170 and the separation layer 171, contamination or the like of the separation layer 171 from the substrate 170 can be prevented.

Subsequently, openings 172a and 172b are provided by selectively removing the insulating films 156 to 158 (FIG. 4B). The openings 172a and 172b may be provided in any shape such as a linear shape or a circular shape, and are provided to avoid the thin film transistor 175. In addition, the openings 172a and 172b can be provided by a photolithography method or laser light irradiation.

Subsequently, the openings 172a and 172b are provided with bending materials 173a and 173b, respectively (FIG. 4C).

Then, the element formation layer 180 is separated from the substrate 170. Here, after forming an opening 176 by selectively irradiating the element formation layer 180 with laser light, the element formation layer 180 is separated from the substrate 170 using physical force. As another separation method, separation may be performed after exposing the separation layer 171 by forming the opening 176 and after removing the separation layer 171 by introducing an etchant into the opening 176 (FIG. 5A). In this case, the separation layer 171 may be removed completely, or may be removed so as to remain partially by controlling etching conditions. Here, the separation layer 171 is removed so as to remain partially. By removing the separation layer 171 so as to remain partially, the element formation layer 180 is not completely separated from the substrate 170 even after removing the separation layer 171, and can be prevented from being separated apart. Further, etching time can be shortened and the amount of etchant used can be reduced; therefore, improvement in operating efficiency and reduction in cost can be achieved.

Subsequently, an adhesive film 177 is attached to a surface of the insulating film 158, and the element formation layer 180 is separated from the substrate 170 (FIG. 5B). Here, the substrate 170 is connected to the insulating film 154 in the element formation layer 180 with the separation layer which remains partially; therefore, the element formation layer 180 is separated from the substrate 170 using a physical means.

Figure 3B:
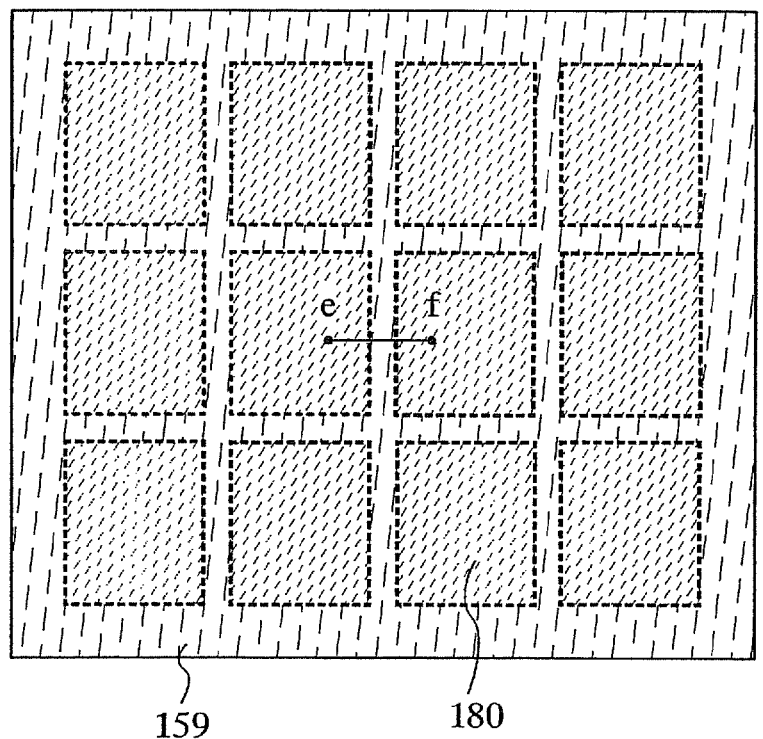

Subsequently, the element formation layer 180 is sealed with flexible substrates 151 and 159 (FIG. 3B and FIG. 5C). A specific example of sealing is shown in FIG. 6A. A surface of the element formation layer 180 on the side from which the substrate 170 is separated is attached to the film-like substrate 151, and the film 177 is separated. Thereafter, a surface of the element formation layer 180 on the side from which the film 177 is separated is attached to the film-like substrate 159 to seal the element formation layer 180. At this time, if a sealing roller 192 which performs either or both heat treatment and pressure treatment, a supply roller 191 which is wound with the film-like substrate 159, and a conveyor belt 190 are used, the semiconductor device sealed with the substrates 151 and 159 can be formed sequentially. Subsequently, the substrates 151 and 159 are cut by a cutting means 193.

Through the above steps, a flexible semiconductor device can be provided (FIG. 6B). Note that the semiconductor device may be completed at a stage where the element formation layer 180 is provided over the flexible substrate 151 without being sealed with the substrate 159. Hereinafter, a material or the like used in the above steps is specifically explained.

As the substrate 170, a glass substrate, a quartz substrate, a metal substrate, a semiconductor substrate, a stainless-steel substrate, or the like, over one surface of which an insulating film is formed, can be used. There is no significant limitation on an area or a shape of such a substrate. Therefore, if a rectangular substrate having a side of one meter or more is used as the substrate 170, for example, productivity can be improved dramatically. Such an advantage is a significant superiority over the case of using a circular silicon substrate. In addition, since the separated substrate 170 can be reused in this embodiment mode, the semiconductor device can be manufactured at lower cost. Even in the case of using a quartz substrate whose cost is high, for example, there is an advantage in that the semiconductor device can be manufactured at low cost by using the quartz substrate repeatedly.

When an insulating film is provided as a base film between the substrate 170 and the separation layer 171, the insulating film can have a single-layer structure of an insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or a laminated structure thereof. The above insulating film can be formed by a sputtering method or various CVD methods such as a plasma CVD method.

As the separation layer 171, a metal film, a laminated structure of a metal film and a metal oxide film, a semiconductor film of Si or the like, a silicon oxide film, or the like can be used. As the metal film, a single layer of a film made of an element selected from tungsten (W), molybdenum (Mo), titanium (Ti), tantalum (Ta), niobium (Nd), nickel (Ni), cobalt (Co), zirconium (Zr), zinc (Zn), ruthenium (Ru), rhodium (Rh), lead (Pd), osmium (Os), and iridium (Ir) or an alloy material or a compound material containing the element as its main component, or a laminated layer thereof is formed. In addition, the film of the above material can be formed by a sputtering method or various CVD methods such as a plasma CVD method. As the laminated structure of a metal film and a metal oxide film, after forming the metal film, oxide of the metal film can be provided on the surface of the metal film by performing plasma treatment in an oxygen atmosphere or heat treatment in an oxygen atmosphere. For example, in the case of providing, for example, a tungsten film which is formed by a sputtering method as the metal film, a metal oxide film formed of tungsten oxide can be formed on the surface of the tungsten film by performing plasma treatment on the tungsten film. In this case, oxide of tungsten is expressed as $WO_X$. X is 2 to 3, and there are cases where X is 2 ($WO_2$), X is 2.5 ($W_2O_5$), X is 2.75 ($W_4O_{11}$), X is 3 ($WO_3$), and the like. In forming the oxide of tungsten, there is no particular limitation on the above given value of X, and it may be determined which oxide is formed, based on an etching rate or the like. Further, a metal nitride film or a metal oxynitride film may be used in place of the metal oxide film. In this case, plasma treatment or heat treatment may be performed on the metal film in a nitrogen atmosphere or a $N_2O$ atmosphere. As another method, a metal oxide film can be provided on the surface of the metal film by forming the insulating film 154 in an oxygen atmosphere by a sputtering method after forming the metal film. Further, a metal oxide film can be provided on the surface of the metal film by performing sputtering in an oxygen atmosphere using metal as a target after forming the metal film. In this case, the metal film and the metal oxide film can be formed with different metal elements. Note that these methods can also form a metal nitride film or a metal oxynitride film on the metal film by performing sputtering in a nitrogen atmosphere or in a nitrogen and oxygen atmosphere.

The element formation layer 180 has at least the insulating film 154, the thin film transistor 175, the insulating film 156, the insulating film 157, and the insulating film 158. All kinds of integrated circuits such as a CPU, a memory, or a microprocessor can be provided using the element formation layer 180. In addition, the element formation layer 180 can take a form having an antenna in addition to the thin film transistor 175. For example, an integrated circuit including a thin film transistor can be operated using AC voltage which is generated in an antenna, and can perform transmission to a reader/writer by modulating AC voltage which is applied to the antenna. Note that the antenna may be formed with the thin film transistor, or may be formed separately from the thin film transistor and electrically connected later.

The insulating film 154 can be formed by a sputtering method, a plasma CVD method, or the like to have a single-layer structure of an insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film or a laminated structure thereof. In the case of providing the insulating film 154 to have a two-layer structure, for example, a silicon nitride oxide film may be formed as a first insulating film, and a silicon oxynitride film may be formed as a second insulating film. Further, in the case of providing the insulating film 154 to have a three-layer structure, a silicon oxynitride film may be formed as a first insulating layer, a silicon nitride oxide film may be formed as a second insulating film, and a silicon oxynitride film may be formed as a third insulating film.

The thin film transistor 175 may have any structure. For example, an impurity region (including a source region, a drain region, and an LDD region) may be formed, or a p-channel type, an n-channel type, or a CMOS circuit which is a combination of a p-channel type and an n-channel type may be provided. In addition, an insulating film (sidewall) may be formed to be in contact with a side face of a gate electrode which is provided above a semiconductor film. Either or both the source and drain regions and the gate electrode may be provided with a silicide layer of nickel, molybdenum, cobalt, or the like. As a semiconductor in the thin film transistor 175, an amorphous semiconductor or a crystalline semiconductor can be used. However, in the case of using a higher-performance thin film transistor, the thin film transistor is preferably provided using a crystalline semiconductor. In this case, an amorphous semiconductor film is formed over the insulating film 154 by a sputtering method, an LPCVD method, or a plasma CVD method, or the like. Subsequently, the amorphous semiconductor film is crystallized by a crystallization method (such as a laser crystallization method, a thermal crystallization method using RTA or an annealing furnace, a thermal crystallization method using a metal element which promotes crystallization, or a combined method of the thermal crystallization method using a metal element which promotes crystallization and the laser crystallization method) to form a crystalline semiconductor film.

The insulating film 156 can be formed using a similar material to the material described in the above embodiment mode.

The insulating films 157 and 158 can be formed using a similar material to the material described in the above embodiment mode. In particular, a material, for example, an organic material such as epoxy, polyimide, polyamide, polyvinylphenol, benzocyclobutene, or acrylic, a siloxane-based material, or the like can be formed by using a spin coating method, a droplet discharge method, a printing method, or the like. Therefore, planarization and improvement in efficiency of processing time can be achieved. In addition, the insulating films 157 and 158 may be formed using the same material or separate materials.

As the conductive film 194, a single layer of an element selected from Al, Ni, C, W, Mo, Ti, Pt, Cu, Ta, Au, and Mn or an alloy containing a plurality of the elements, or a laminated layer thereof can be used. For example, for a conductive film formed of an alloy containing a plurality of the elements, an Al alloy containing C and Ti (Al—Ti—C), an Al alloy containing Ni (Al—Ni), an Al alloy containing C and Ni (Al—Ni—C), an Al alloy containing C and Mn (Al—Mn—C), or the like can be used.

The bending materials 173a and 173b can be formed using a similar material to the material which is used for the bending material 163 described in the above embodiment mode. The bending materials 173a and 173b can be provided by using a droplet discharge method, a printing method such as a screen printing method, a spin coating method, or the like.

As the etchant, a gas or a liquid containing halide can be used. For example, $ClF_3$ (chlorine trifluoride), $NF_3$ (nitrogen trifluoride), $BrF_3$ (bromine trifluoride), or HF (hydrogen fluoride) can be used. Note that a silicon oxide film is used as the separation layer in the case of using HF.

As the film 177, a flexible film can be used, at least one surface of which is provided with an adhesive. For example, a sheet material which is provided with an adhesive over a base film used as a base material such as polyester can be used. As the adhesive, a material formed of a resin material including an acrylic resin or the like or a synthetic rubber material can be used.

As the substrates 151 and 159, a flexible film can be used. For example, a film formed of polypropylene, polyester, vinyl, polyvinyl fluoride, vinyl chloride, or the like; paper formed of a fibrous material; a laminated film of a base material film (such as a polyester film, a polyamide film, an inorganic evaporated film, or paper) and an adhesive synthetic resin film (such as an acrylic synthetic resin film or an epoxy synthetic resin film); or the like can be used. In addition, the film is attached by heat and pressure to a treatment object by performing heat treatment and pressure treatment. When heat treatment and pressure treatment are performed, an adhesive layer provided on the outermost surface of the film or a layer provided in the outermost layer (not the adhesive layer) is melted by heat treatment, and the film is attached by pressure. Note that the element formation layer 180 may be sealed using the film 177 and the substrate 159.

The semiconductor device of the invention is not limited to the above structure, and can be provided in another structure. A specific example thereof is explained with reference to FIGS. 7A to 10C.

In the above-described structure of the semiconductor device, an example of filling the bending portion with a material which is bent more easily than the insulating films 156 to 158 is shown. However, as shown in FIG. 7A, the bending portion can be provided as spaces 178a and 178b without being filled with anything. The spaces 178a and 178b can be provided by a photolithography method, laser light irradiation, or the like. Alternatively, a cut or the like may be formed using a physical means.

By providing the space by selectively removing the insulating films 156 to 158, strain can be selectively concentrated in the bending portion provided as the spaces 178a and 178b when external force such as bending is applied to the semiconductor device. Accordingly, strain due to stress applied to a transistor can be reduced; therefore, damage or the like of the transistor can be prevented. In addition, since a material filling step can be omitted by providing the bending portion as a space, improvement in efficiency of a manufacturing process can be achieved.

As shown in FIGS. 7B and 7C, bending materials 181a and 181b may be provided as the bending portion so as to penetrate the element formation layer 180 (FIG. 7C), or may be provided inside the element formation layer without penetrating (FIG. 7B). Manufacturing processes of both cases are explained with reference to FIGS. 8A to 8D and FIGS. 9A to 9C.

First, a manufacturing process of the semiconductor device shown in FIG. 7B is shown in FIGS. 8A to 8D.

A separation layer 171 is formed over a substrate 170, and an insulating film 154, a thin film transistor 155, an insulating film 156, and an insulating film 157 are formed over the separation layer 171 (FIG. 8A).

Subsequently, in order to provide a conductive layer which is electrically connected to an impurity region of a semiconductor film of the thin film transistor 155, an opening 195 is selectively formed in the insulating film 156 and the insulating film 157 to expose the semiconductor film of the thin film transistor 155. Note that openings 182a and 182b are simultaneously formed at this time (FIG. 8B).

Then, the openings 182a and 182b are provided with bending materials 179a and 179b, and the opening 195 is provided with a conductive film 194 (FIG. 8C).

Subsequently, an insulating film 158 is formed to cover the conductive film 194, and an opening 183 is formed in the insulating films 154 and 156 to 158 to expose the separation layer 171 (FIG. 8D).

Thereafter, the semiconductor device is completed by performing similar steps to those shown in FIGS. 5B and 5C (FIG. 7B). Since the openings 182a and 182b can be provided at the same time as the opening 195 by using the method shown in FIGS. 8A to 8D, the manufacturing process can be simplified.

Subsequently, a manufacturing process of the semiconductor device shown in FIG. 7C is shown in FIGS. 9A to 9C.

First, a separation layer 171 is formed over a substrate 170, and an element formation layer 180 including an insulating film 154, a thin film transistor (TFT) 155, an insulating film 156, an insulating film 157, a conductive film 194, and an insulating film 158 is formed over the separation layer 171 (FIG. 9A).

Subsequently, openings 184a, 184b, and 185 are provided by selectively removing the insulating films 154 and 156 to 158 (FIG. 9B). The openings 184a and 184b can be provided by a photolithography method or laser light irradiation.

The, the openings 184a and 184b are provided with bending materials 181a and 181b (FIG. 9C).

Thereafter, the semiconductor device is completed by performing similar steps to those shown in FIGS. 5B and 5C (FIG. 7C). In the case where the openings 184a, 184b, and 185 are simultaneously provided by using the method shown in FIGS. 9A to 9C, the manufacturing process can be simplified. In addition, by providing the bending portion so as to penetrate the element formation layer 180, a thin film transistor or the like can be effectively prevented from being damaged even when force such as bending is applied to the semiconductor device.

In FIG. 9B, the bending portion can be also provided as spaces without providing anything in the openings 184a and 184b. In this case, since an etchant can be introduced also from the openings 184a and 184b, the separation layer 171 can be efficiently removed.

In addition, in FIGS. 9A to 9C, openings 186a, 186b, and 187 may be provided by removing the insulating films 154 and 156 to 158 and the separation layer 171 (FIG. 10A). In this case, bending materials 188a and 188b provided in the openings 186a and 186b are connected to the substrate 170. Therefore, even when the separation layer 171 is completely removed, the substrate 170 and the element formation layer 180 are connected to each other with the bending materials 188a and 188b, and can therefore be prevented from being separated apart. Thereafter, the semiconductor device can be completed by separating the element formation layer 180 from the substrate 170 using a physical means and performing sealing treatment.

Figure 29A:
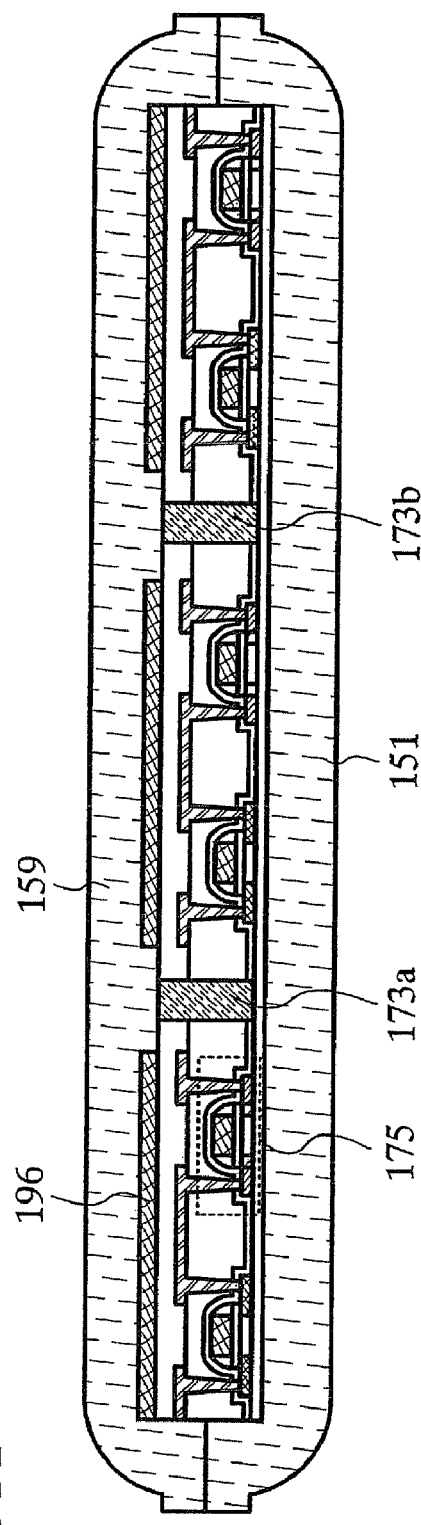
FIGS. 29A and 29B show examples of a semiconductor device of the present invention.

In addition, the semiconductor device may have a structure as shown in FIG. 29A in which a protective film 196 is provided in a region including the transistor 175, which is preferably not bent. The protective film 196 is formed of a material which is harder to be bent than at least a material provided between transistors (here, bending materials 173a and 173b). For example, a material having a higher elastic modulus, a material having a higher glass transition point, a material having higher hardness, a material having lower plasticity, or the like than those of the bending materials 173a and 173b can be used for the protective film 196. Further, the protective film 196 can be provided not only above but also below the transistor 175. For the protective film 196, metal such as W, Ti, Mo, Ni, Ta, or Mn, a thermosetting resin such as a phenol resin, a urea resin, a melamine resin, an unsaturated polyester resin, an acrylic resin, an epoxy resin, or a silicon resin, or the like can be used. Alternatively, a material having high hardness such as so-called ceramics can be used. Further, a similar material to the bending materials 173a and 173b can be used. However, even in that case, the protective film 196 is formed of a material having a higher elastic modulus, a material having a higher glass transition point, a material having higher hardness, a material having lower plasticity, or the like than that of the material used for the bending materials 173a and 173b.

Figure 29B:
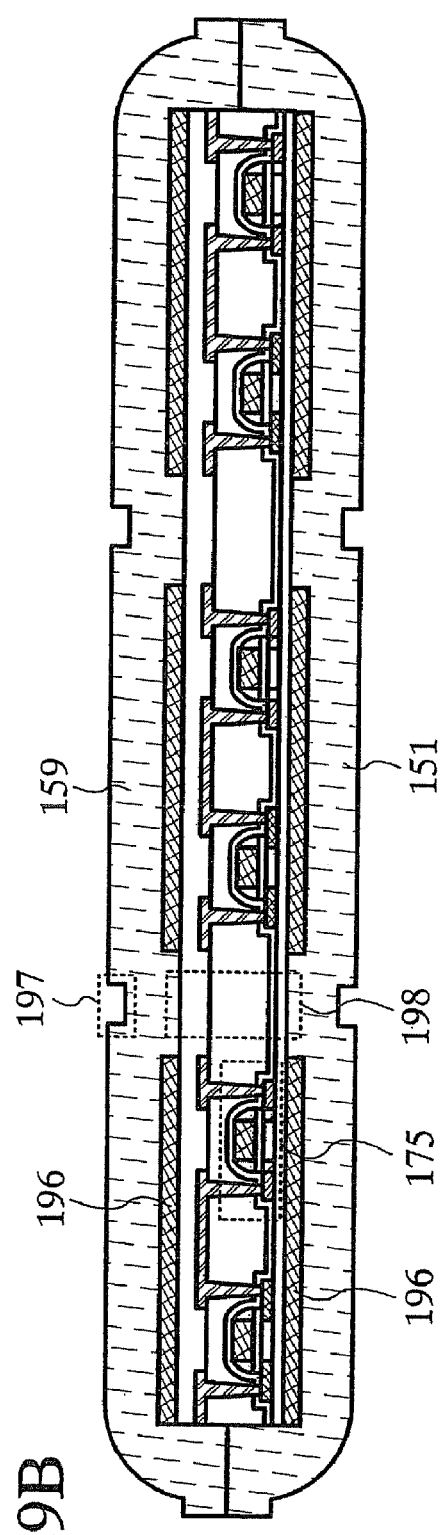

In addition, the semiconductor device may have a structure in which either or both the substrate 151 and the substrate 159 in a portion where the protective film is not provided are provided with a depression 197 as shown in FIG. 29B as well as the structure of FIG. 29A. Note that FIG. 29B shows an example of providing the protective films 196 above and below the transistor. In addition, it is acceptable as long as the protective films 196 in FIG. 29B are formed of a material which is harder to be bent than a lamination body of the insulating films or the like in a portion 198 located between the transistors. The portion 198 can be provided with a bending material. By providing a film-like substrate for sealing an element formation layer with a depression as described above, stress is concentrated in the depression when stress is applied to the semiconductor device. Therefore, stress which is applied to the transistor can be reduced and damage can be prevented.

Note that a method, in which an element formation layer is provided over a rigid substrate such as a glass substrate, and then the element formation layer is separated and provided over a flexible substrate, is described in this embodiment mode as a method for manufacturing a semiconductor device. However, the method for manufacturing a semiconductor device of the invention is not limited thereto. For example, after providing an element formation layer over a glass substrate or a semiconductor substrate of Si or the like, the glass substrate or the semiconductor substrate of Si or the like may be thinned by grinding treatment or polishing treatment. In this case, a flexible semiconductor device can be manufactured without performing separation. In addition, an example of providing a thin film transistor as an element provided in an integrated circuit is described; however, the invention is not limited thereto. Even in the case of providing a diode, a capacitor element, or the like, a bending portion can be provided in the same manner between diodes or capacitor elements.

Note that this embodiment mode can be freely combined with the above embodiment mode.

Embodiment Mode 3

In this embodiment mode, a structure of a semiconductor device, which is different from that described in the above embodiment mode is explained with reference to drawings.

In the case where a transistor is placed alone or nearly alone in an integrated circuit provided in a semiconductor device, damage due to static electricity, damage due to stress from outside, or the like is caused more easily. Thus, by providing a dummy pattern or a dummy transistor formed of a semiconductor of silicon or the like, metal, or the like around the transistor as shown in FIGS. 11A to 11E, destruction of the transistor due to static electricity or stress can be reduced. Hereinafter, an explanation is made with reference to FIGS. 11A to 11E.

Figure 11A:
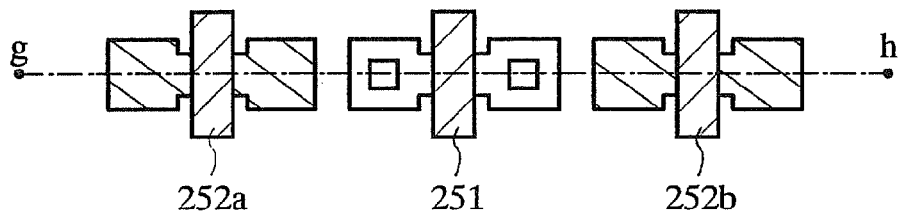
FIGS. 11A to 11E show examples of a semiconductor device of the present invention.
Figure 11B:
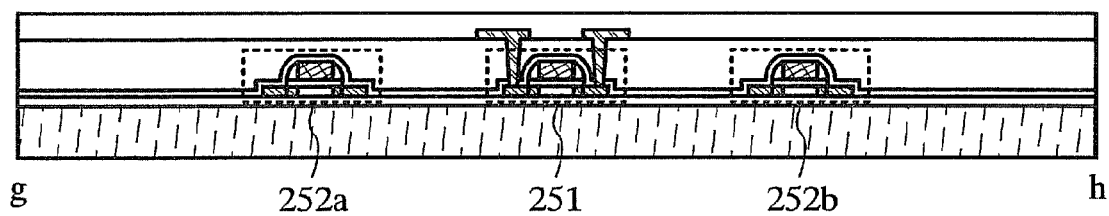

FIG. 11A shows an example of placing dummy transistors 252a and 252b adjacent to a transistor 251 in a source-drain direction thereof. FIG. 11B shows a cross-sectional view taken along line g-h in FIG. 11A. The dummy transistors 252a and 252b can be provided in the same manner as the transistor 251.

Figures 11C, 11D:
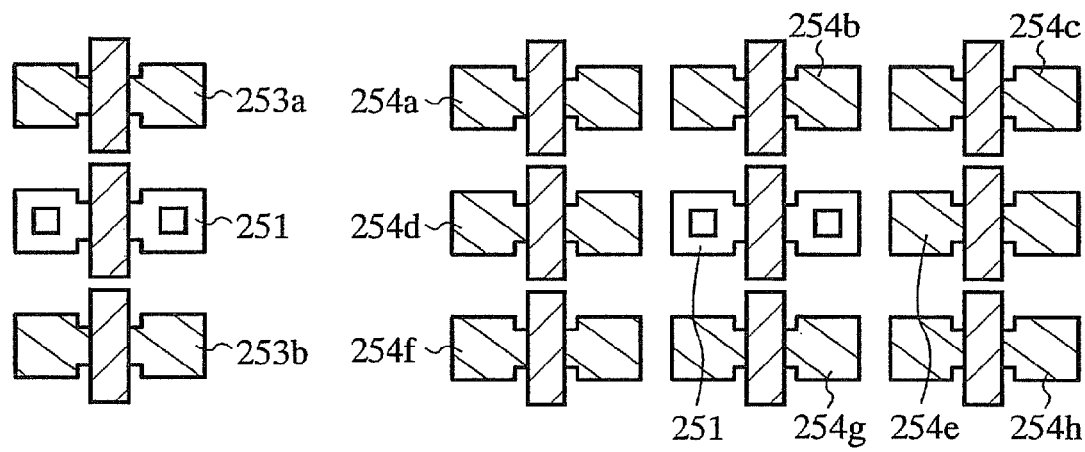

Alternatively, as shown in FIG. 11C, dummy transistors 253a and 253b can be provided adjacent to the transistor 251 in a direction perpendicular to the source-drain direction thereof. Naturally, as shown in FIG. 11D, dummy transistors 254a to 254h may be provided on all sides of the transistor 251. By providing a dummy transistor around a transistor which is placed alone or nearly alone as described above, the transistor 251 can be prevented from being destructed due to static electricity, stress, or the like.

Figure 11E:
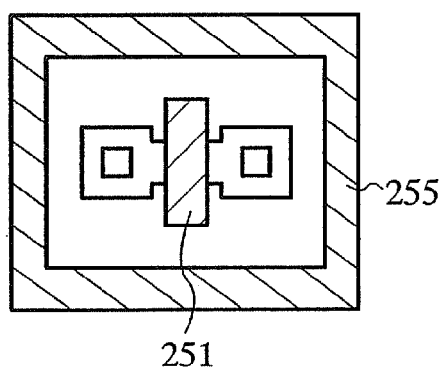

Further, as shown in FIG. 11E, a dummy pattern 255 may be provided around the transistor 251 using a semiconductor, metal, insulating film, or the like. By using a material which is easily bent as described in the above embodiment mode for the dummy pattern 255, the semiconductor device bends with strain selectively generated in the dummy pattern 255 when the semiconductor device is bent. Therefore, the dummy pattern 255 can suppress strain to be generated in the transistor 251 and prevent the transistor from being destructed.

Note that destruction of the transistor or the like in the semiconductor device can be prevented more effectively, even when physical force such as bending is applied to the semiconductor device, by providing the bending portion described in the above embodiment mode in addition to the dummy transistor or dummy pattern shown in FIGS. 11A to 11E.

Figure 19:
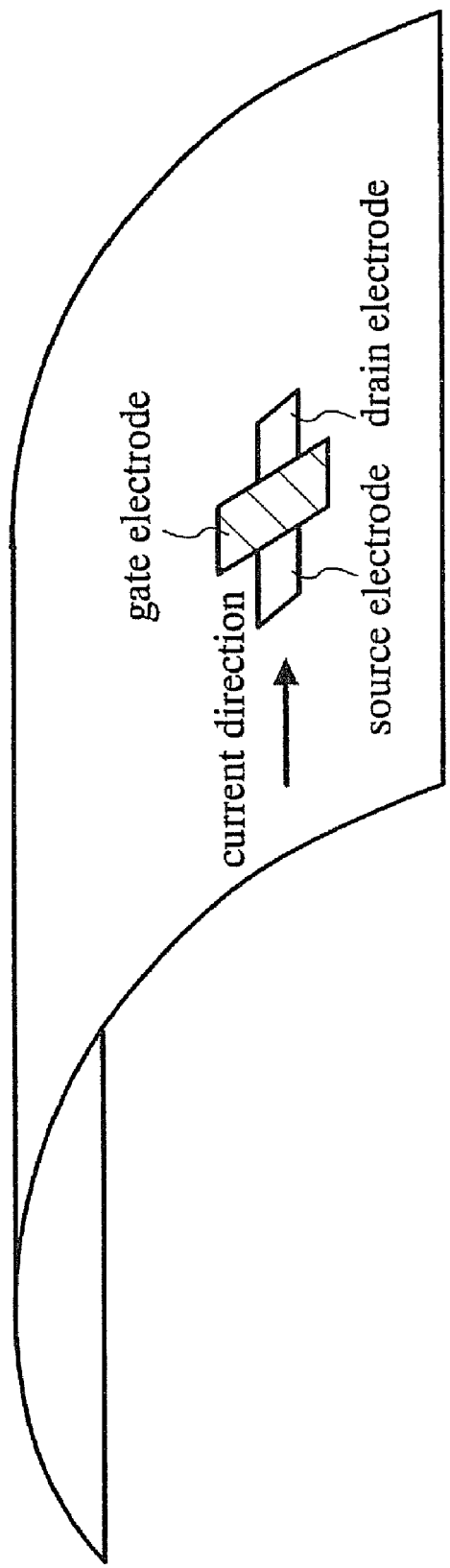
FIG. 19 shows an example of a semiconductor device of the present invention.

In addition, by providing the transistor in consideration of strain which is generated by stress applied to the semiconductor device, destruction of the transistor or the like can be prevented effectively. For example, in the case of providing the semiconductor device over a curved surface by attachment, the semiconductor device is preferably provided so that a direction of a generatrix of the curved surface is aligned with a direction in which a carrier of the transistor moves (FIG. 19). With this structure, even when the semiconductor device is bent to have a curved surface created by movement of a generatrix of a conical surface, a cylindrical surface or the like, a corresponding influence on the transistor can be suppressed.

Moreover, in order to prevent an element such as a transistor from being destructed due to stress or the like, a proportion of an area of an active region (silicon island portion) in the element such as a transistor to the entire area is preferably 5% to 50%.

Note that this embodiment mode can be freely combined with the above embodiment mode.

Embodiment Mode 4

An example of a method for manufacturing a semiconductor device, which is different from that described in the above embodiment mode, is explained with reference to drawings.

In this embodiment mode, an example of providing an integrated circuit over a substrate by attachment is described.

Figure 12A:
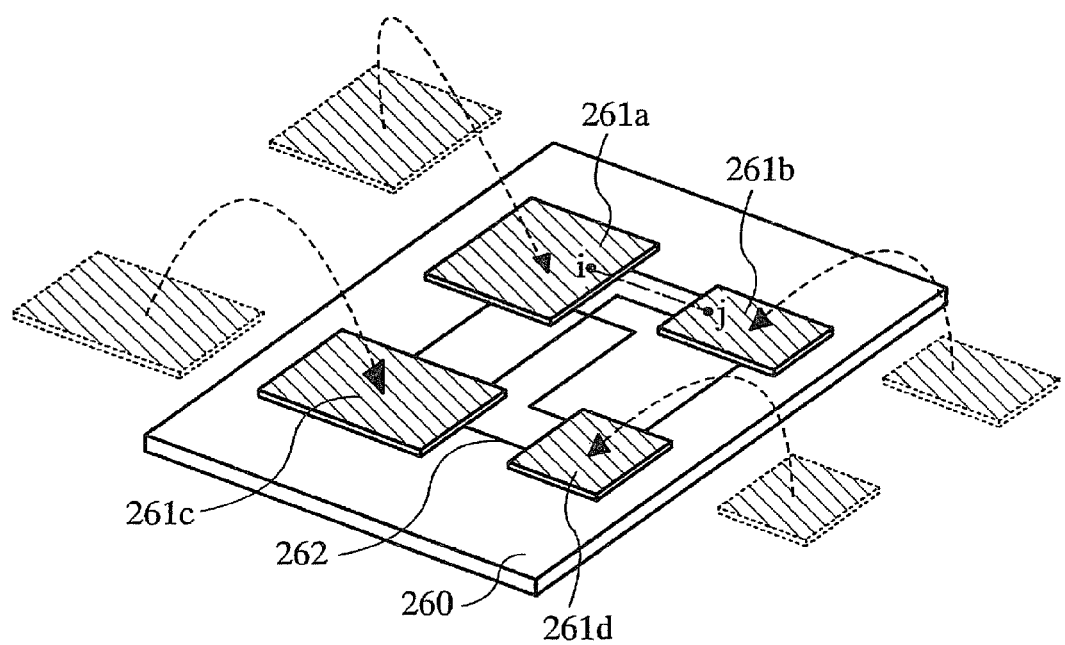
FIGS. 12A and 12B show an example of a semiconductor device of the present invention.

As shown in FIG. 12A, integrated circuits 261a to 261d are provided over a substrate 260 by attachment (FIG. 12A). The integrated circuits 261a to 261d provided over the substrate 260 are electrically connected to each other with a wiring 262. A schematic diagram of a cross-sectional structure along line i-j in FIG. 12A is shown in FIG. 12B.

Figure 12B:
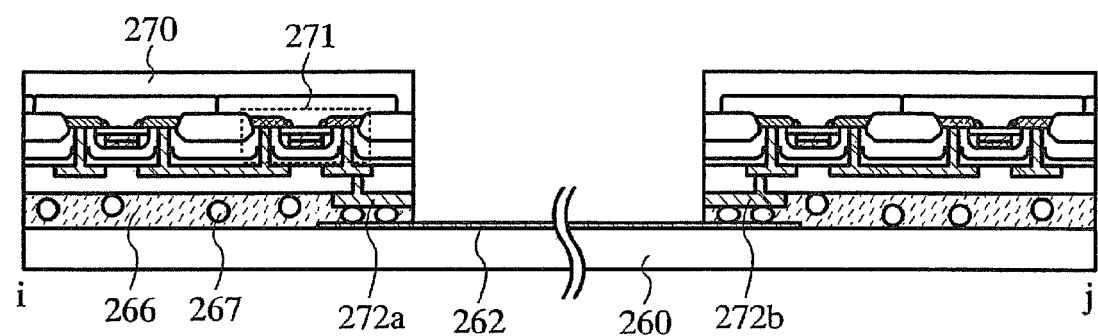

In FIG. 12B, terminal portions 272a and 272b of the integrated circuits 261a and 261b are electrically connected to the wiring 262. Here, the terminal portions 272a and 272b are connected to the wiring 262 through a conductive particle 267 which is included in a resin 266 serving as an adhesive. As a transistor included in the integrated circuit, a thin film transistor (TFT), a field effect transistor (FET) in which a channel region is formed in a semiconductor substrate, an organic transistor, or the like can be used. Here, an example of using a field effect transistor 271, which is provided using a single crystal silicon substrate 270 as a channel region, is shown. A high-performance transistor can be formed by forming a channel region of the transistor using a semiconductor substrate of single crystal silicon or the like.

Figure 13A:
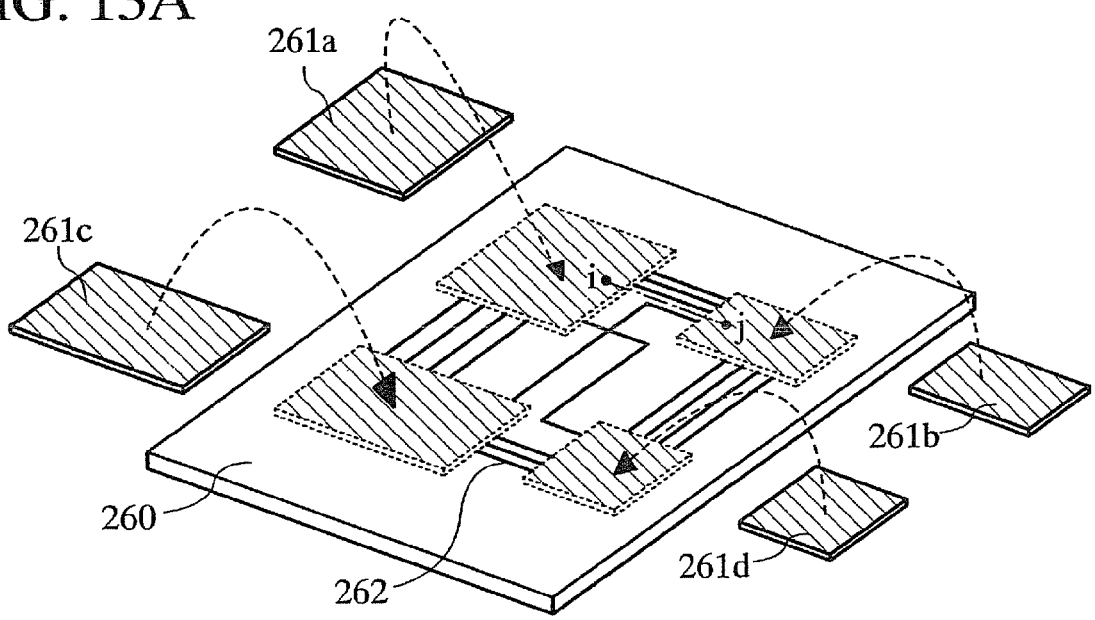
FIGS. 13A and 13B show an example of a semiconductor device of the present invention.
Figure 13B:
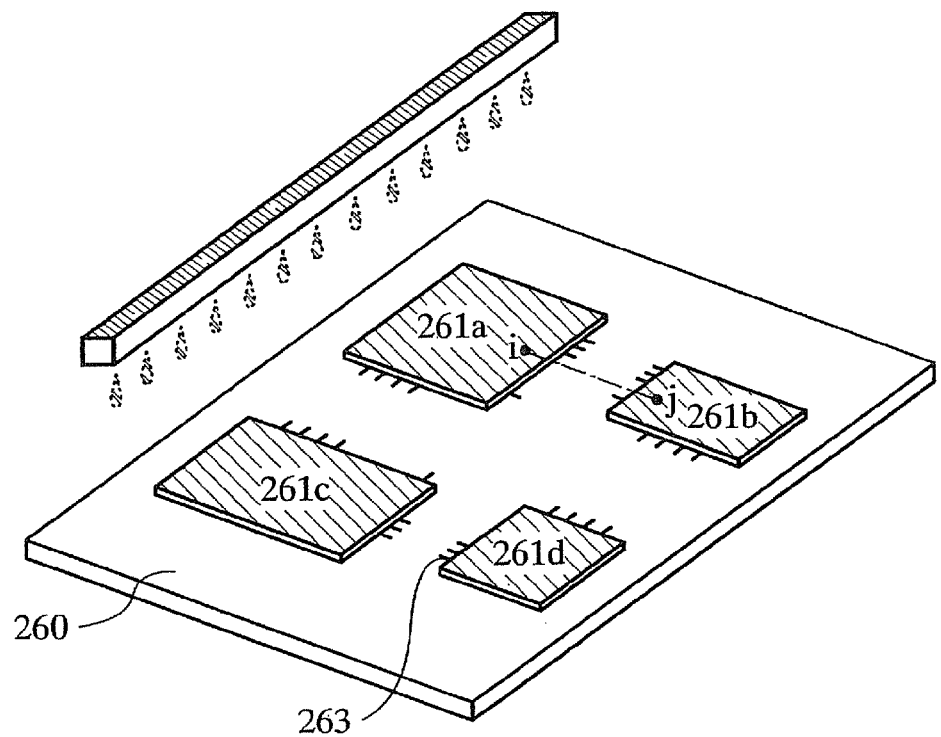

In the case of forming a semiconductor device by attaching the integrated circuits 261a to 261d to the substrate 260 as shown in FIGS. 12A and 12B, there are a method in which the integrated circuits 261a to 261d are provided over the substrate 260 which is provided with the wiring 262 in advance (FIG. 13A) and a method in which the wiring 262 is formed after providing the integrated circuits 261a to 261d over the substrate 260 by attachment (FIG. 13B). Hereinafter, each method is explained with reference to drawings.

Figure 14A:
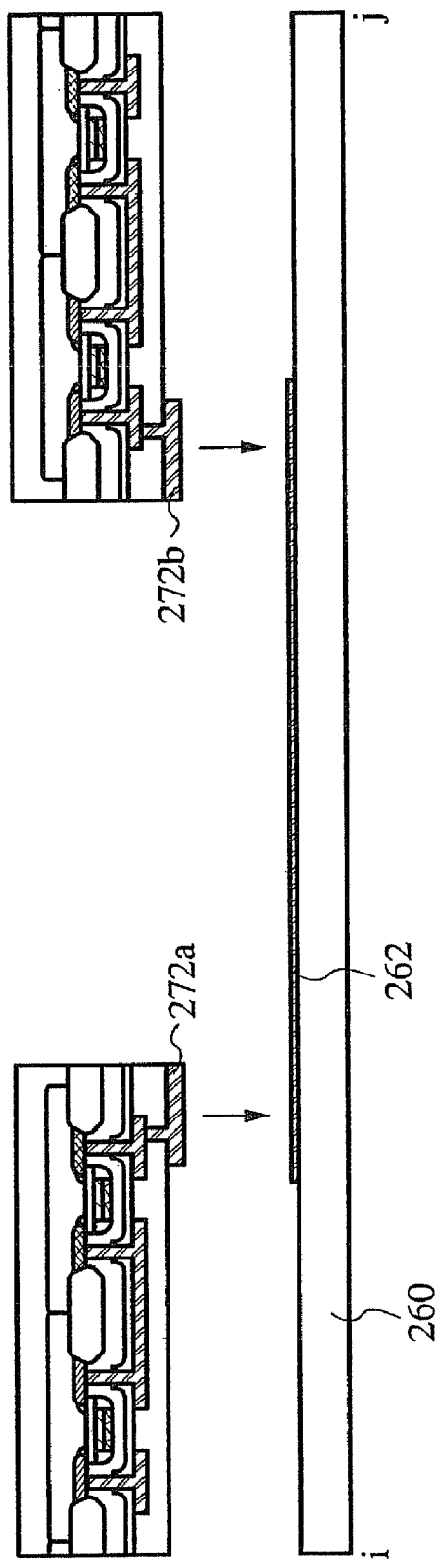
FIGS. 14A and 14B show an example of a method for manufacturing a semiconductor device of the present invention.
Figure 14B:
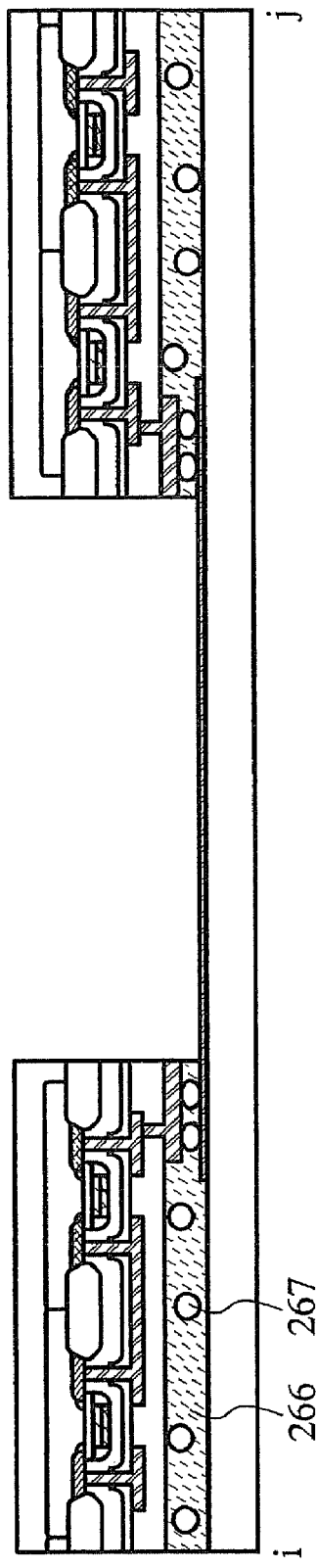

In the case of providing an integrated circuit over a substrate which is provided with a wiring in advance as shown in FIG. 13A, a terminal portion formed in the integrated circuit is attached to the wiring provided over the substrate so as to be electrically connected. Here, the wiring 262 which is formed in advance over the substrate 260 is electrically connected to the terminal portions 272a and 272b which are provided in the integrated circuits 261a and 261b so as to be exposed (FIG. 14A). Here, the terminal portions 272a and 272b are connected to the wiring 262 through the conductive particle 267 which is included in the resin 266 serving as an adhesive (FIG. 14B).

On the other hand, in the case of forming a wiring after providing an integrated circuit over a substrate as shown in FIG. 13B, a conductive film serving as a wiring is formed after attaching a terminal portion provided in an integrated circuit to a conductive film provided over the substrate so as to be electrically connected. Here, after electrically connecting a conductive film 263 which is formed in advance over the substrate 260 to the terminal portions 272a and 272b which are provided in the integrated circuits 261a and 261b so as to be exposed (FIG. 15A), a conductive film 265 serving as a wiring is formed by a droplet discharge method or a printing method such as a screen printing method (FIG. 15B). Note that the integrated circuit can be accurately provided over the substrate 260 by attachment by using the conductive film 263 which is formed in advance over the substrate 260 as an alignment marker. Note that the droplet discharge method is a method for forming a composition containing a conductive material, an insulating material, or the like in an arbitrary position by discharging a droplet (also referred to as a dot) thereof, and is also referred to as an ink-jet method depending on its mode.

As the wiring 262, the conductive film 263, and the conductive film 265, a single layer of an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), and tantalum (Ta) or an alloy containing a plurality of the elements, or a laminated layer thereof can be used.

Figure 16A:
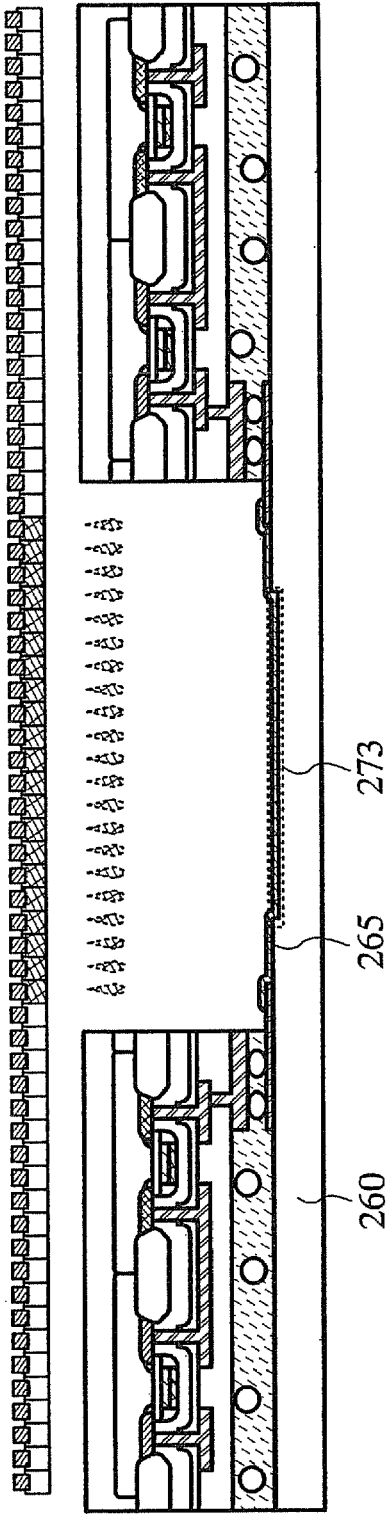
FIGS. 16A to 16C show an example of a method for manufacturing a semiconductor device of the present invention.
Figure 16B:
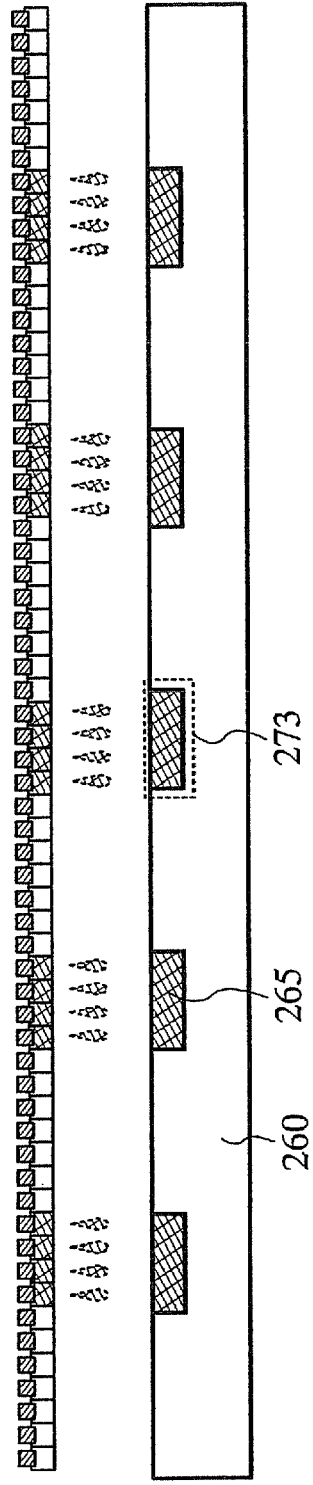

In the case of forming the conductive film 265 using a droplet discharge method, a screen printing method, or the like, the conductive film 265 can be formed over the substrate 260 with more accuracy by providing the substrate 260 with a depression 273 in a portion where the conductive film 265 serving as a wiring is provided (FIGS. 16A and 16B). The depression 273 provided in the substrate 260 can formed by pressing a metal pattern formed of metal such as nickel (Ni), cobalt (Co), copper (Cu), iron (Fe), or zinc (Zn) or an alloy thereof, a pattern formed by processing silicon, or the like having a wiring pattern against the substrate 260. Alternatively, a depression having a wiring pattern can be formed by irradiating the substrate 260 with laser light. Moreover, not by providing the depression by laser light irradiation or the like but by changing a surface property (such as a hydrophilic property or a hydrophobic property) of the substrate 260, a discharged droplet can be made to selectively hit the surface.

Figure 16C:
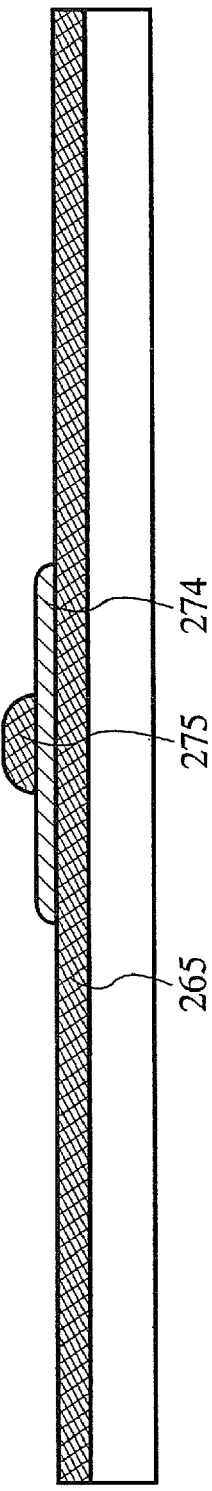

When the two conductive films 265 and 275, which are formed over the substrate 260 and serve as wirings, intersect with each other, an insulating film 274 is provided by a droplet discharge method only in an intersecting portion of the conductive films 265 and 275 so that the two conductive films are not electrically connected to each other (FIG. 16C). By forming the insulating film only in the intersecting portion of the conductive films, improvement in efficiency of material use or process can be achieved.

Subsequently, the case of sealing a plurality of integrated circuits which is provided over the substrate 260 is explained with reference to FIGS. 17A to 17C.

Figure 17A:
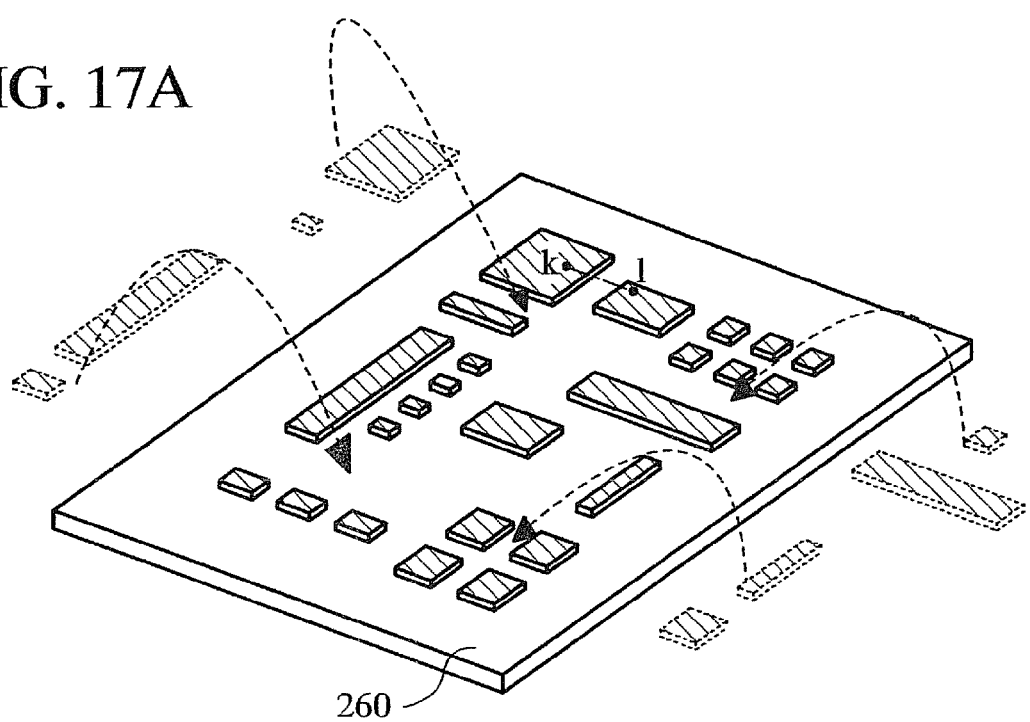
FIGS. 17A to 17C show examples of a semiconductor device of the present invention.

In the case of providing a plurality of integrated circuits over the substrate 260 as shown in FIG. 17A, sealing is preferably performed so that the integrated circuits are not damaged by strain which is generated when stress is applied to a semiconductor device. Therefore, a bending portion which bends with strain selectively generated when stress is applied to the semiconductor device is provided between the integrated circuits. Further, by providing a large number of more minute integrated circuits, the number of bending portions formed between the integrated circuits is increased. Accordingly, damage of the integrated circuits when the semiconductor device is bent can be prevented. Examples of a cross-sectional view along line k-1 in FIG. 17A are shown in FIGS. 17B and 17C.

Figure 17B:
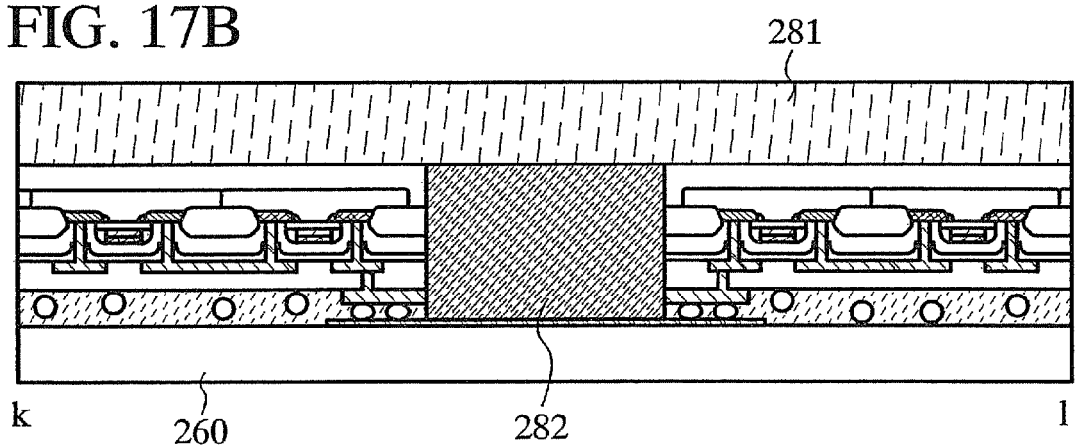

In FIG. 17B, a material 282 which is easily bent with strain selectively generated is provided between the integrated circuits provided over the substrate 260, and a flexible film 281 is provided to cover the integrated circuits. It is acceptable as long as the material 282 is bent more easily than the integrated circuit and the film 281. For example, a material having a lower elastic modulus or a material having higher plasticity than those of the integrated circuit and the film 281, a material having a lower glass transition point than that of the film 281, or the like can be used.

Figure 17C:
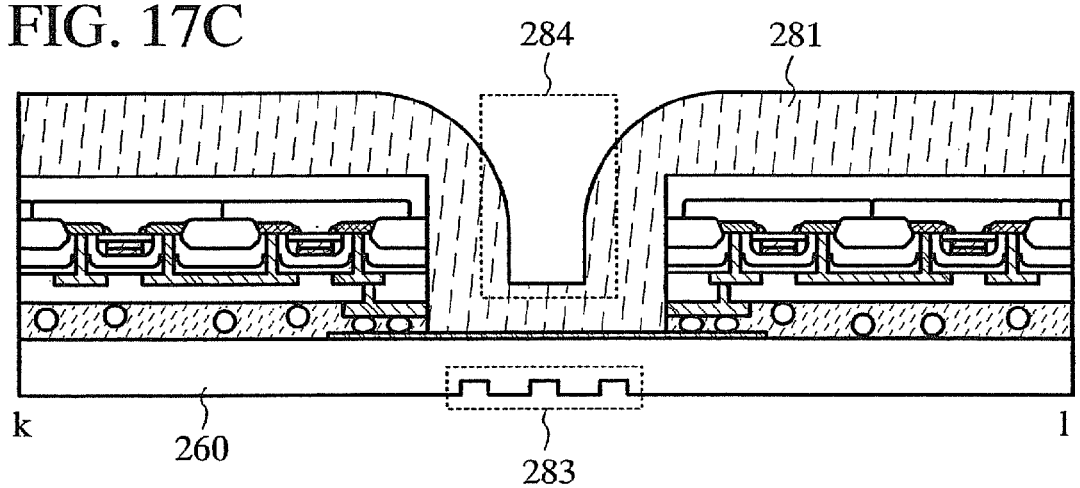

Further, in the case of covering the integrated circuit with the flexible film 281 or the like, the bending portion can be provided between the integrated circuits by performing sealing so as to form a space 284 between the integrated circuits as shown in FIG. 17C. In addition, by providing the substrate 260 in the bending portion with an uneven pattern 283 and bending the semiconductor device with stress concentrated in the bending portion, stress can be prevented from being applied to the integrated circuit. In addition, in FIGS. 17B and 17C, a structure in which a protective film is provided above a transistor before providing the film 281 as shown in FIGS. 29A and 29B can be employed.

Note that an example of a face-down type semiconductor device is given in this embodiment mode; however, a face-up type semiconductor device can naturally be used (FIG. 18A). Here, a conductive film 265 is formed using a droplet discharge method, a printing method, or the like after attaching an integrated circuit having a conductive film 285 to a substrate 260, thereby connecting the conductive film 285 and the conductive film 265 to each other. Alternatively, the face-up type semiconductor device can be provided by being mounted by a wire bonding method or the like.

In this embodiment mode, the example of using the field effect transistor (FET), in which a channel region is formed in a semiconductor substrate, as the integrated circuit is described; however, this embodiment mode is not limited thereto. For example, a thin film transistor (TFT) can also be used (FIG. 18B). In this case, by providing a bending portion 286 also between thin film transistors 175 as described in the above embodiment mode, the semiconductor device can be sharply bent with less force and the transistor can be prevented from being damaged.

Note that this embodiment mode can be freely combined with the above embodiment mode.

Embodiment Mode 5

In this embodiment mode, a semiconductor device which can exchange data without contact can be manufactured by providing the flexible semiconductor device described in the above embodiment mode with an antenna. The semiconductor device which can exchange data without contact is generally referred to as an RFID (Radio Frequency Identification) tag (also referred to as an IC tag, an IC chip, an RF (Radio Frequency) tag, a wireless tag, an electronic tag, or a wireless chip). An example of the semiconductor device which can exchange data without contact is hereinafter explained with reference to drawings.

Generally, the semiconductor device which can exchange data without contact (hereinafter also referred to as an RFID tag) has an integrated circuit and an antenna, and can exchange data with an outside device (reader/writer) without contact through the antenna. Therefore, the semiconductor device which can exchange data without contact can be manufactured by providing the semiconductor device described in the above embodiment mode with a conductive film serving as an antenna. For example, the semiconductor device 150 shown in FIG. 1A can be provided with a conductive film serving as an antenna. In this case, at least one of, for example, a power supply circuit, a clock generation circuit, a demodulation circuit, a modulation circuit, a memory circuit, a control circuit which controls another circuit, and the like is included as the integrated circuits 152*a* to 152*d* in FIG. 1. Next, specific examples of a structure provided with an antenna are shown in FIGS. 20A and 20B and FIGS. 21A and 21B.

Figure 20A:
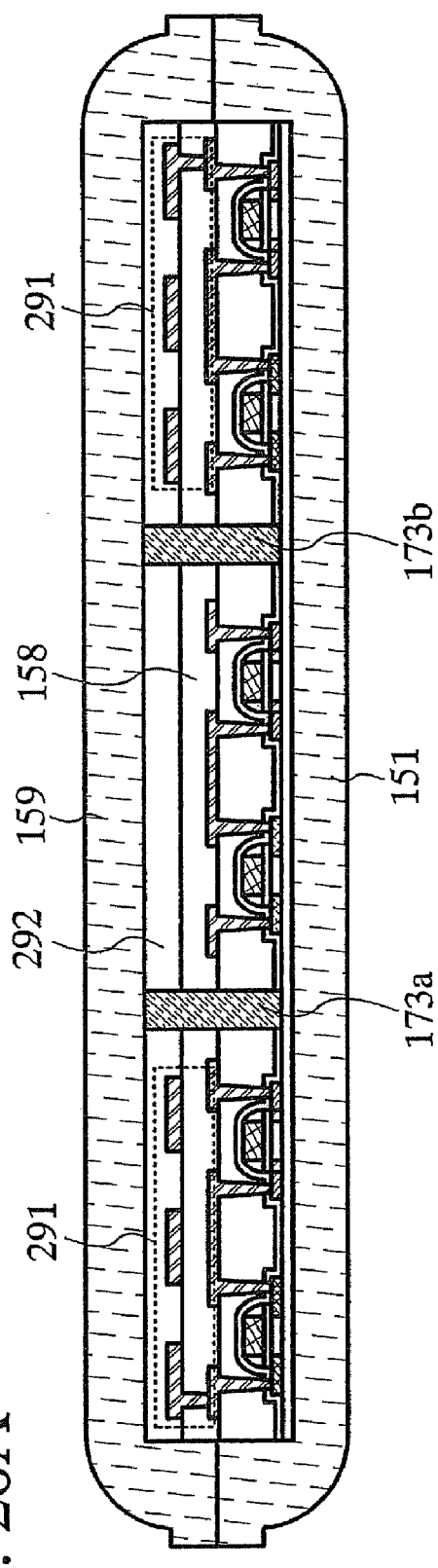
FIGS. 20A and 20B show an example of a semiconductor device of the present invention.

FIG. 20A shows an example of providing the semiconductor device described in Embodiment Mode 1 with a conductive film 291 serving as an antenna. The conductive film 291 can be provided by forming it over the insulating film 158 of FIGS. 4A to 4C in Embodiment Mode 2. After forming an insulating film 292 to cover the conductive film 291, openings are formed in portions to be bending portions, and the openings are filled with bending materials 173*a* and 173*b*.

The conductive film 291 can be formed using a conductive material which contains one or more of metal or a metal compound of copper (Cu), aluminum (Al), silver (Ag), gold (Au), chromium (Cr), molybdenum (Mo), titanium (Ti), tantalum (Ta), tungsten (W), nickel (Ni), and the like. In addition, the insulating film 292 can be formed using a single-layer structure of an insulating film containing oxygen or nitrogen such as a silicon oxide ($SiO_X$) film, a silicon nitride ($SiN_X$) film, a silicon oxynitride ($SiO_XN_Y$) (X>Y) film, or a silicon nitride oxide ($SiN_XO_Y$) (X>Y) film; a film containing carbon such as a DLC (diamond like carbon) film; an organic material such as epoxy, polyimide, polyamide, polyvinylphenol, benzocyclobutene, or acrylic; a siloxane-based material; or the like, or a laminated structure thereof.

Naturally, the semiconductor device which can exchange data without contact can also be manufactured by providing the structure shown in FIG. 7A to 7C with the conductive film serving as an antenna.

Figure 20B:
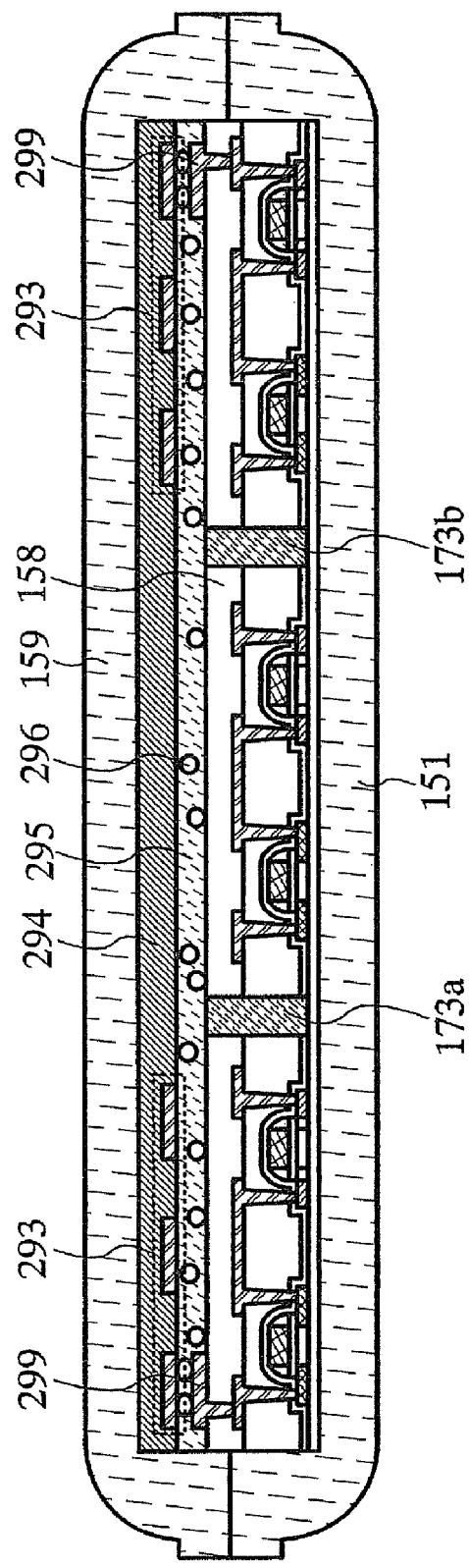

FIG. 20B shows an example of attaching an antenna substrate 294 provided with a conductive film 293 serving as an antenna to the element formation layer of the semiconductor device described in Embodiment Mode 1. In this case, the element formation layer and the antenna substrate to be used are separately manufactured.

The element formation layer is attached to the antenna substrate with a resin 295 serving as an adhesive. A conductive film 299 formed over the insulating film 158 is electrically connected to the conductive film 293 serving as an antenna through a conductive particle 296 which is included in the resin 295.

As described above, the antenna may be provided by directly forming the conductive film serving as an antenna over the element formation layer, or by separately forming the conductive film serving as an antenna over the antenna substrate and then attaching the conductive film to the element formation layer.

Figure 21A:
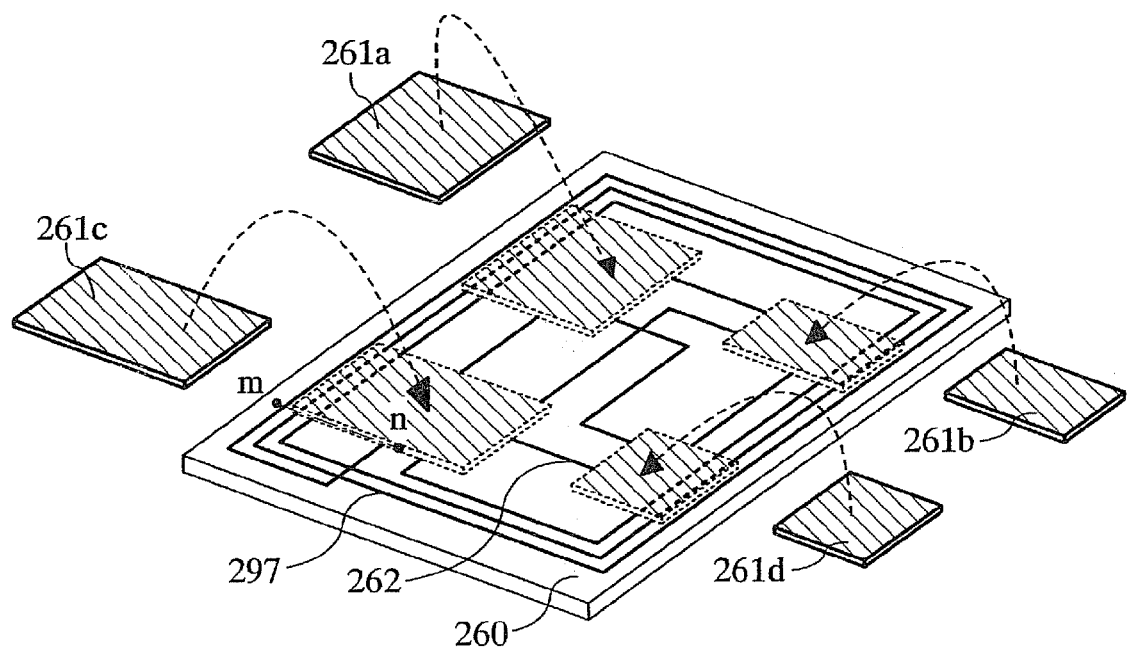
FIGS. 21A and 21B show an example of a semiconductor device of the present invention.
Figure 21B:
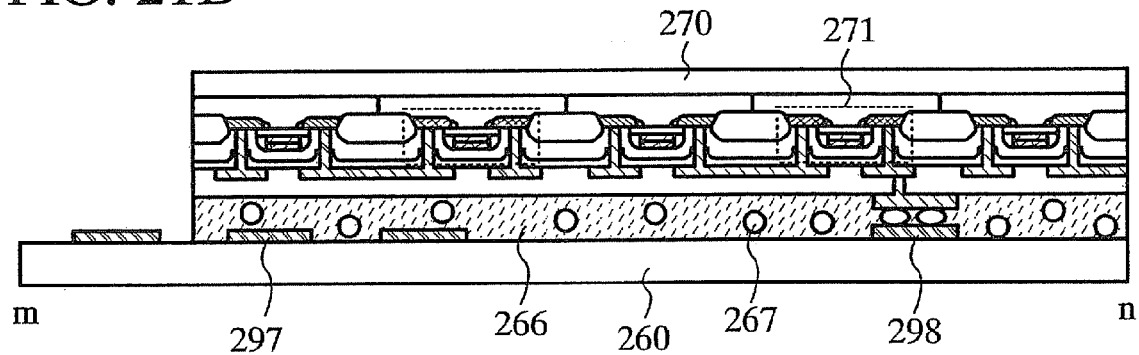

FIGS. 21A and 21B show an example of providing the semiconductor device described in Embodiment Mode 4 with an antenna. Here, a semiconductor device which can exchange data without contact is manufactured by providing the integrated circuits 261*a* to 261*d* over the substrate 260 which is provided in advance with a conductive film 297 serving as an antenna (FIG. 21A). In this case, at least one of, for example, a power supply circuit, a clock generation circuit, a demodulation circuit, a modulation circuit, a memory circuit, a control circuit which controls another circuit, and the like is included in the integrated circuits 261*a* to 261*d*.

The conductive film 297 serving as an antenna can be provided in the same manner as the wiring 262. In this case, the conductive film 297 serving as an antenna can be connected to the integrated circuit by connecting a conductive film 298 to a terminal portion 272 of the integrated circuit through the conductive particle 267 included in the resin 266 serving as an adhesive as in Embodiment Mode 4 (FIG. 21B).

Figure 15A:
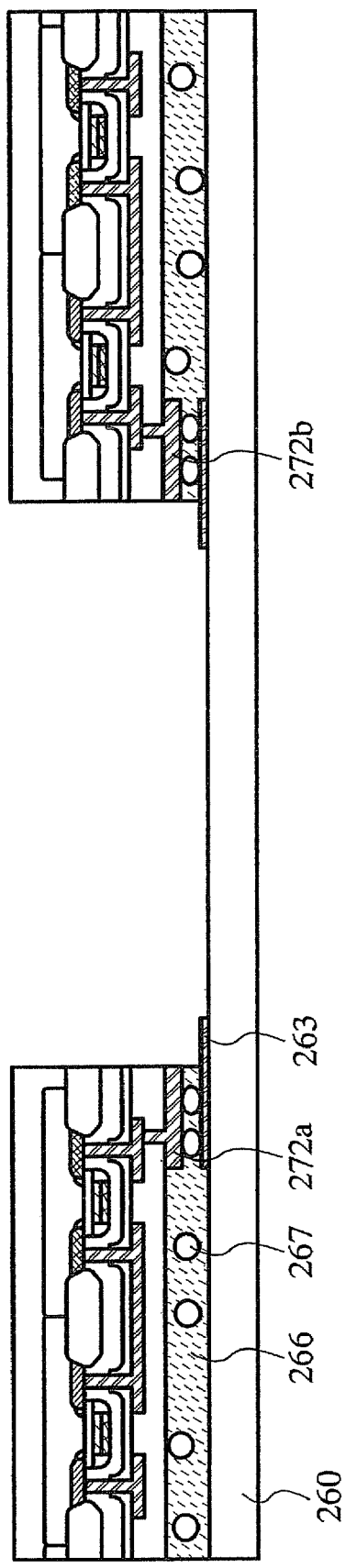
FIGS. 15A and 15B show an example of a method for manufacturing a semiconductor device of the present invention.
Figure 15B:
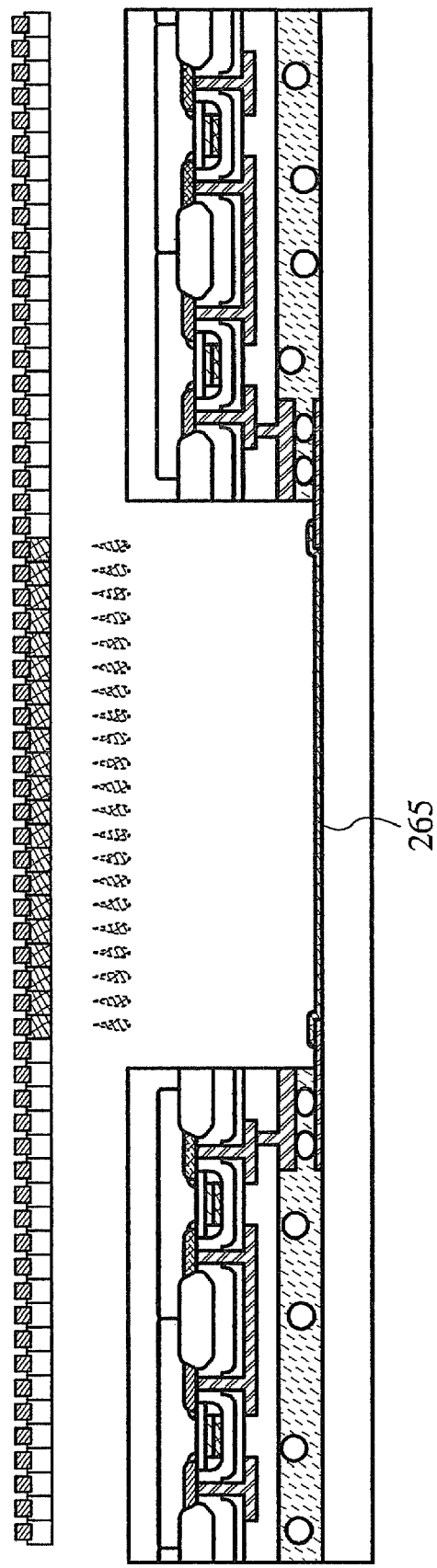

Note that as shown in FIGS. 15A and 15B, the conductive film 297 serving as an antenna can be formed simultaneously with the conductive film serving as a wiring by using a droplet discharge method, a printing method, or the like after forming the integrated circuits 261*a* to 261*b* over the substrate 260.

In addition, this embodiment mode is not limited to the structures shown in FIGS. 20A and 20B and FIGS. 21A and 21B. The semiconductor device described in the above embodiment mode may be combined with the antenna in any manner as long as the semiconductor device is provided with the antenna.

Subsequently, an application example of the semiconductor device which can exchange data without contact is hereinafter explained with reference to drawings.

Figure 22A:
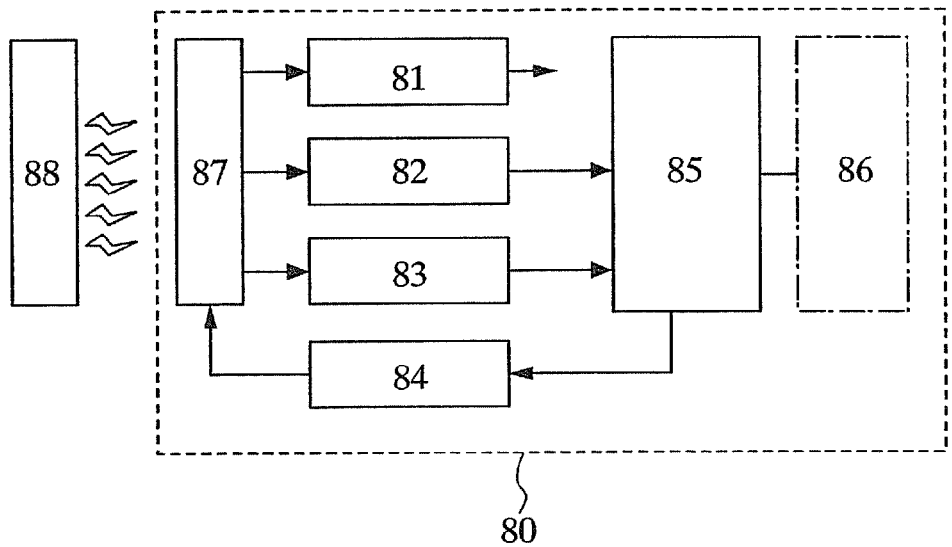
FIGS. 22A to 22C show examples of an application of a semiconductor device of the present invention.

An RFID tag 80 has a function of exchanging data without contact, and has a power supply circuit 81, a clock generation circuit 82, a data demodulation circuit 83, a data modulation circuit 84, a control circuit 85 which controls another circuit, a memory circuit 86, and an antenna 87 (FIG. 22A). Note that the number of the memory circuit is not limited to one, and may be plural. An SRAM, a flash memory, a ROM, a FeRAM, a memory using an organic compound layer for a memory element portion, or the like can be used.

A signal which is transmitted from a reader/writer 88 as a radio wave is converted into an AC electrical signal at the antenna 87 by electromagnetic induction. The power supply circuit 81 generates a power supply voltage using the AC electrical signal and supplies the power supply voltage to each circuit using a power supply wiring. The clock generation circuit 82 generates various kinds of clock signals based on the AC signal inputted from the antenna 87, and supplies the clock signals to the control circuit 85. The demodulation circuit 83 demodulates the AC electrical signal and supplies it to the control circuit 85. The control circuit 85 performs various kinds of arithmetic processing in accordance with the inputted signal. The memory circuit 86 stores a program, data, or the like used in the control circuit 85, and can also be used as an operation area at the time of arithmetic processing. Then, data is transmitted from the control circuit 85 to the modulation circuit 84, and load modulation can be applied from the modulation circuit 84 to the antenna 87 in accordance with the data. The reader/writer 88 can read data as a result of receiving the load modulation applied to the antenna 87 as a radio wave.

In addition, the RFID tag may supply a power supply voltage to each circuit by a radio wave without a power source (battery) mounted, or by a radio wave and a power source (battery) with the power source (battery) mounted.

Since an RFID tag which can be bent can be manufactured by using the structure described in the above embodiment mode, the RFID tag can be provided over an object having a curved surface by attachment.

Figure 22B:
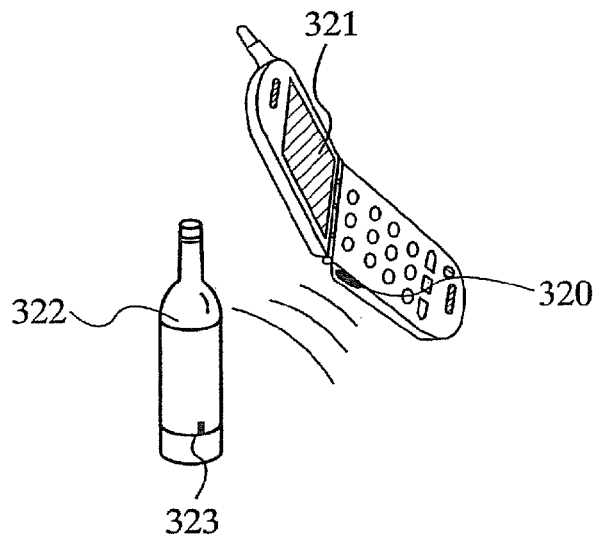
Figure 22C:
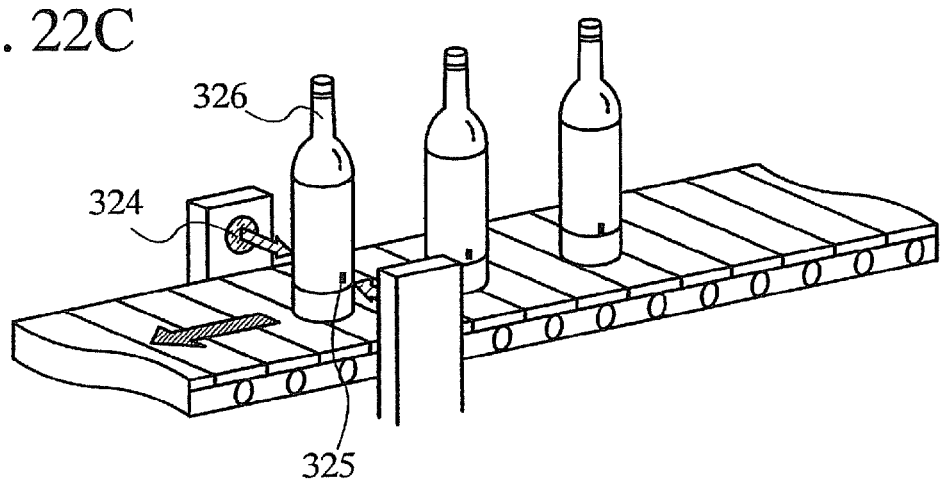
Figure 23A:
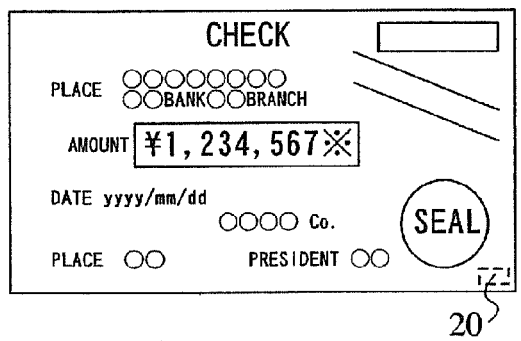
FIGS. 23A to 23H show examples of an application of a semiconductor device of the present invention.
Figure 23B:
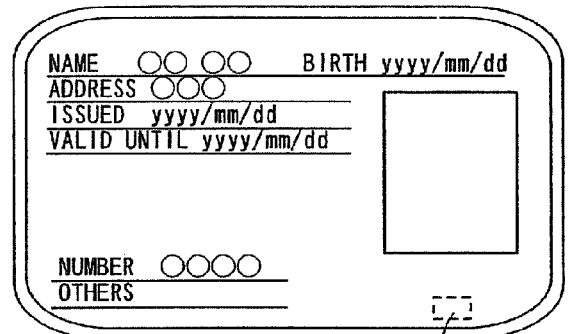
Figure 23C:
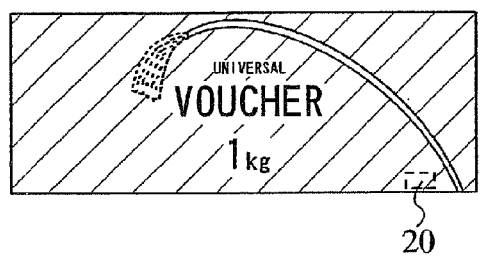
Figure 23D:
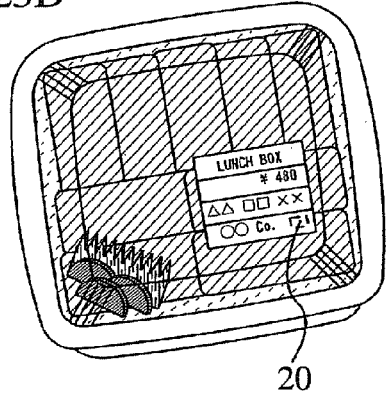
Figure 23E:
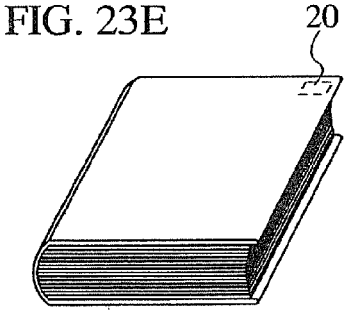
Figure 23F:
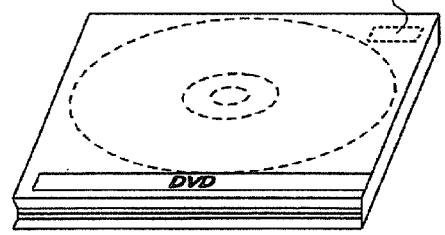
Figure 23G:
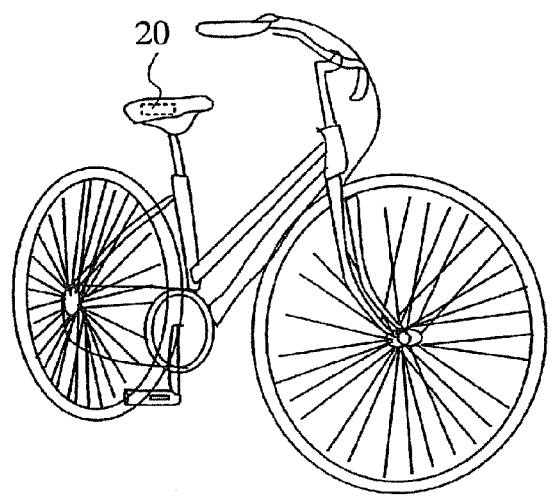
Figure 23H:
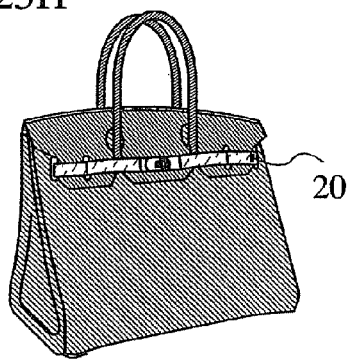

Subsequently, an example of an application of a flexible RFID tag is explained. A side face of a portable terminal including a display portion 321 is provided with a reader/writer 320, and a side face of an article 322 is provided with an RFID tag 323 (FIG. 22B). When the reader/writer 320 is held over the RFID tag 323 included in the article 323, information on the article 322 such as a raw material, the place of origin, an inspection result in each production process, the history of distribution, or an explanation of the article is displayed on the display portion 321. Further, when a product 326 is transported by a conveyor belt, the product 326 can be inspected using a reader/writer 324 and an RFID tag 325 provided over the product 326 (FIG. 22C). Thus, by utilizing RFID for a system, information can be acquired easily, and improvement in functionality and added value of the system can be achieved. As described in the above embodiment mode, a transistor or the like included in an RFID tag can be prevented from being damaged even when the RFID tag is attached to an object having a curved surface, and a reliable RFID tag can be provided.

In addition, as a signal transmission method in the above-described semiconductor device which can exchange data without contact, an electromagnetic coupling method, an electromagnetic induction method, a microwave method, or the like can be used. The transmission system may be appropriately selected by a practitioner in consideration of an intended use, and an optimum antenna may be provided in accordance with the transmission method.

In the case of employing, for example, an electromagnetic coupling method or an electromagnetic induction method (for example, a 13.56 MHz band) as the signal transmission method in the semiconductor device, electromagnetic induction caused by a change in magnetic field density is used. Therefore, the conductive film serving as an antenna is formed in an annular shape (for example, a loop antenna) or a spiral shape (for example, a spiral antenna).

In the case of employing, for example, a microwave method (for example, a UHF band (860 to 960 MHz band), a 2.45 GHz band, or the like) as the signal transmission method in the semiconductor device, the shape such as a length of the conductive film serving as an antenna may be appropriately set in consideration of a wavelength of an electromagnetic wave used for signal transmission. For example, the conductive film serving as an antenna can be formed in a linear shape (for example, a dipole antenna), a flat shape (for example, a patch antenna), a ribbon-like shape, or the like. The shape of the conductive film serving as an antenna is not limited to a linear shape, and the conductive film serving as an antenna may be provided in a curved-line shape, a meander shape, or a combination thereof, in consideration of a wavelength of an electromagnetic wave.

Subsequently, an example of a management method of a product mounted with an RFID tag is explained with reference to a drawing.

Figure 30:
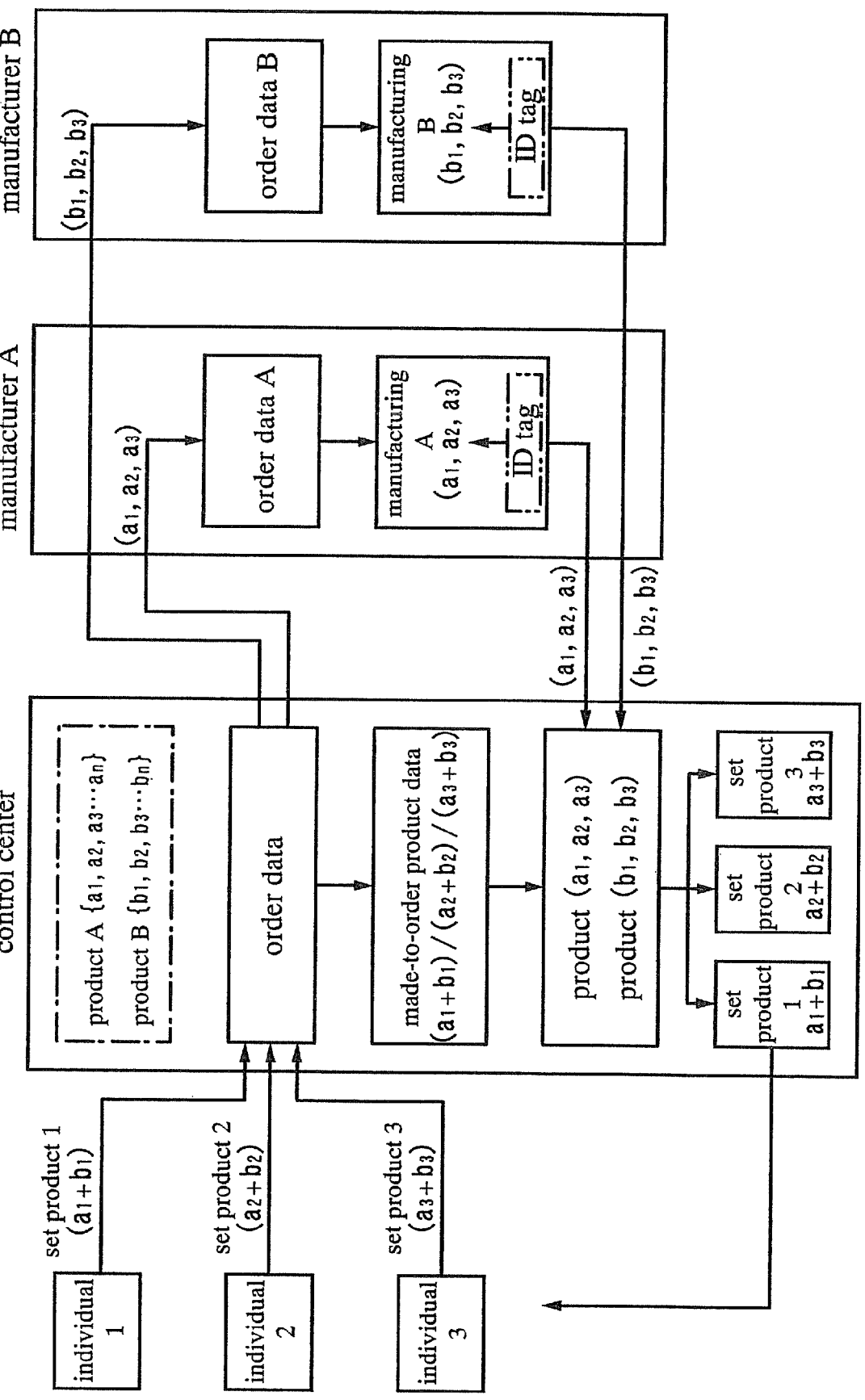
FIG. 30 shows an example of an application of a semiconductor device of the present invention.

FIG. 30 is a block diagram showing an example of a made-to-order production management system of a set product. FIG. 30 shows an example of a system in which, when a plurality of individuals who is a consumer or the like orders set products, a control center of the set products sends the set products to the individuals after obtaining products from a manufacturer A and a manufacturer B in accordance with order data of the products. Note that the case where individuals 1 to 3 order products is described here for convenience.

The individuals 1 to 3 can view details of set products which a control center provides and can order desired set products, through a network such as a LAN. Note that a combination of a product A and a product B is assumed as the set product. Note that the product A includes a plurality of products a1, a2, a3, . . . an, and the product B includes a plurality of products b1, b2, b3, . . . bn. The individual can combine desired products separately from the product A and the product B as the set product.

For example, considering the set product including the product A (for example, a tea set) and the product B (for example, tea leaves), the product A includes the plurality of products a1, a2, a3, . . . an, each of which has a different shape or the like, and the product B includes the plurality of products b1, b2, b3, . . . bn, each of which is a different kind. The individuals 1 to 3 order combinations of desired products from the product A and the product B as the set products. Note that the case where the individual 1 orders a set product 1 which is a combination of a1 and b1, the individual 2 orders a set product 2 which is a combination of a2 and b2, and the individual 3 orders a product 3 which is a combination of a3 and b3, is shown here.

When the control center receives orders from the individuals 1 to 3, the control center orders the products from the manufacturer A and the manufacturer B in accordance with order data. The manufacturer A manufactures products a1, a2, and a3 in accordance with order data A which is transmitted from the control center. In manufacturing products, each product is provided with an RFID tag in accordance with the order data A. Similarly, the manufacturer B also manufactures products b1, b2, and b3, each of which is provided with an RFID tag, in accordance with order data B which is transmitted from the control center. Note that an identification number or the like of the RFID tag is assigned in advance to the product ordered by the control center and managed. Thereafter, the products (a1, a2, and a3) and the products (b1, b2, and b3), each of which is provided with an RFID tag, are sent from the manufacturer A and the manufacturer B to the control center.

The control center combines the products a1 to a3 and b1 to b3 which are sent from the manufacturer A and the manufacturer B in accordance with made-to-order product data as the set product 1 (a1+b1), the set product 2 (a2+b2), and the set product 3 (a3+b3). Note that a plurality of products can be easily identified without checking the contents or the like by using the RFID tags mounted on the a1 to a3 and b1 to b3, and can be combined as the set products 1 to 3. Thereafter, the control center sends the set products 1 to 3 to the individuals 1 to 3, respectively.

In the case of combining a plurality of products as one set product as described above, by mounting in advance RFID tags on the products to be combined, a plurality of products can be easily identified through identification using the RFID tags and combined as a desired set product with little labor even in the case of ordering from different manufacturers. Further, by mounting in advance a managed RFID tag on a product to be manufactured, loss, theft, or the like of the product during the period from manufacturing to sale can be effectively suppressed, and cost can be reduced. Furthermore, by using the flexible RFID tag as described in the above embodiment mode, the RFID tag can be mounted on various products such as a product having a curved surface.

In addition, an applicable range of the flexible RFID tag is wide in addition to the above, and the flexible RFID tag can be applied to any product as long as it clarifies information such as the history of an object without contact and is useful for production, management, or the like. For example, the RFID tag can be mounted on paper money, coins, securities, certificates, bearer bonds, packing containers, books, recording media, personal belongings, vehicles, food, clothing, health products, commodities, medicine, electronic devices, and the like. Examples of them are explained with reference to FIGS. 23A to 23H.

The paper money and coins are money distributed to the market and include one valid in a certain area (cash voucher), memorial coins, and the like. The securities refer to checks, certificates, promissory notes, and the like (see FIG. 23A). The certificates refer to driver's licenses, certificates of residence, and the like (see FIG. 23B). The bearer bonds refer to stamps, rice coupons, various gift certificates, and the like (see FIG. 23C). The packing containers refer to wrapping paper for food containers and the like, plastic bottles, and the like (see FIG. 23D). The books refer to hardbacks, paperbacks, and the like (see FIG. 23E). The recording media refer to DVD software, video tapes, and the like (see FIG. 23F). The vehicles refer to wheeled vehicles such as bicycles, ships, and the like (see FIG. 23G). The personal belongings refer to bags, glasses, and the like (see FIG. 23H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), cellular phones, and the like.

Forgery can be prevented by providing the paper money, the coins, the securities, the certificates, the bearer bonds, or the like with an RFID tag. The efficiency of an inspection system, a system used in a rental shop, or the like can be improved by providing the packing containers, the books, the recording media, the personal belonging, the food, the commodities, the electronic devices, or the like with an RFID tag. Forgery or theft can be prevented by providing the vehicles, the health products, the medicine, or the like with an RFID tag; further, in the case of the medicine, medicine can be prevented from being taken mistakenly. The RFID tag can be mounted on the foregoing article by attaching it to the surface or embedding it therein. For example, in the case of a book, the RFID tag may be embedded in a piece of paper; in the case of a package made from an organic resin, the RFID tag may be embedded in the organic resin. By using a flexible RFID tag having the structure described in the above embodiment mode, damage or the like of an element included in the RFID tag can be prevented even when the RFID tag is mounted on paper or the like.

As described above, the efficiency of an inspection system, a system used in a rental shop, or the like can be improved by providing the packing containers, the recording media, the personal belonging, the food, the clothing, the commodities, the electronic devices, or the like with an RFID tag. In addition, by providing the vehicles with an RFID tag, forgery or theft can be prevented. Further, by implanting an RFID tag in a creature such as an animal, an individual creature can be easily identified. For example, by implanting an RFID tag with a sensor in a creature such as livestock, its health condition such as a current body temperature as well as its birth year, sex, kind, or the like can be easily managed.

Note that this embodiment mode can be freely combined with the above embodiment mode.

Embodiment Mode 6

In this embodiment mode, an example of the case of applying the semiconductor device described in the above embodiment mode to a display device is explained with reference to drawings.

Figure 24A:
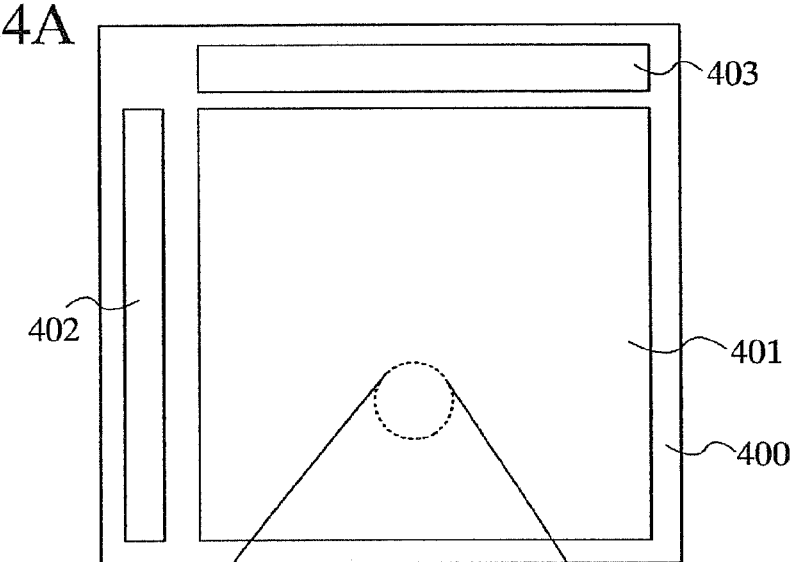
FIGS. 24A and 24B show an example of applying a semiconductor device of the present invention to a display device.

Here, a display device in which a pixel region 401 and driver circuits 402 and 403 are provided over a flexible substrate 400 is given as an example (FIG. 24A).

Figure 24B:
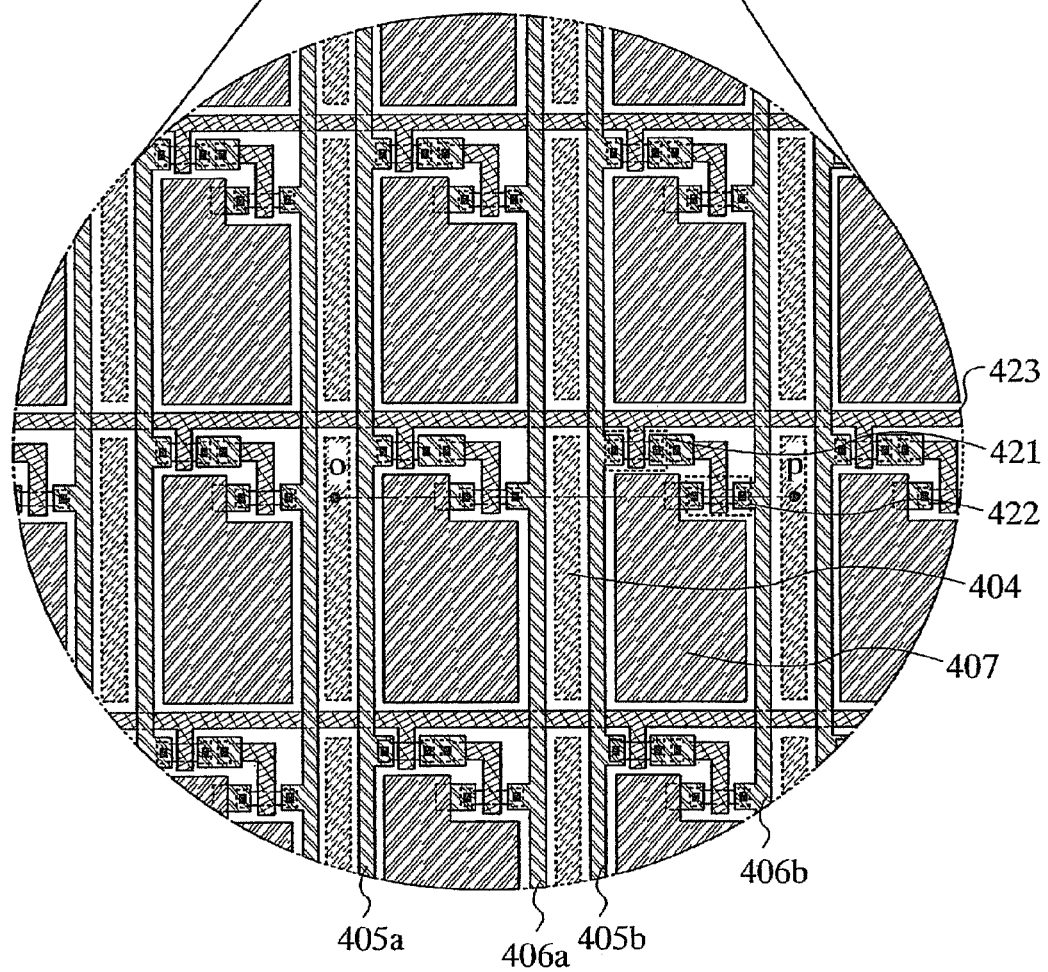

The pixel region 401 has wirings 405a and 405b which serve as a signal line, wirings 406a and 406b which serve as a power supply line, and a wiring 423 which serves as a scanning line and extends in a direction perpendicular to the wirings 405a, 405b, 406a, and 406b, and thin film transistors (TFTs) 421 and 422 and a pixel portion 407 are provided so as to be surrounded by the wiring which serves as a signal line, the wiring which serves as a power supply line, and the wiring which serves as a scanning line. In addition, a bending portion 404 is provided between pixel portions (FIG. 24B). If the bending portion 404 is provided, when the display device is bent (when stress is applied to the display device), the bending portion 404 selectively is bent with strain selectively generated in the bending portion.

Here, one of a source region and a drain region of the TFT 421 is connected to the wiring 405b, and the other is connected to a gate electrode of the TFT 422. In addition, one of a source region and a drain region of the TFT 422 is connected to the wiring 406b, and the other is connected to the pixel portion 407. Further, the bending portion 404 is provided between the wiring 406a and the wiring 405b.

Subsequently, a cross-sectional structure along line o-p in FIG. 24B is shown in FIGS. 25A and 25B.

The TFT 422 is provided over the substrate 400, and one of the source region and the drain region of the TFT 422 is connected to the wiring 406b, and the other is connected to the pixel portion 407. The pixel portion 407 has a pixel electrode 411, a light emitting layer 412, and an opposite electrode 413, and the other of the source electrode and the drain electrode of the TFT 422 is connected to the pixel electrode 411. In addition, an opening 441 is provided with a bending material 442 as the bending portion 404 between the pixel portions. The bending material 422 is provided by filling the opening with a material which is bent more easily than a lamination body of insulating films 431 to 435 (FIG. 25A). For example, the bending material 442 can be provided using a material having a lower elastic modulus, a material having higher plasticity, or a material having a lower glass transition point than that of the lamination body of the insulating films 431 to 435. A reference numeral 410 denotes an opposite substrate.

Note that the bending material 442 is not limited to the above structure, and can be provided after removing any of the insulating films 431 to 435. For example, as shown in FIG. 25B, a structure in which a bending material 444 formed of a material which is bent more easily than a lamination body of the insulating films 431 to 434 is provided in an opening 443 which is provided by removing the insulating films 431 to 434, and then the insulating film 435 is provided thereover, may be employed. Note that the openings 441 and 443 may be left as spaces without being provided with the bending materials 442 and 444.

Subsequently, an example of a method for manufacturing the above-described display device is briefly explained with reference to drawings.

First, a separation layer 171 is formed over a substrate 170, and an element formation layer 445 including an insulating film 431, a transistor 422, insulating films 432 and 433, wirings 405a and 405b, a wiring connected to a source or drain region of the transistor 422, a pixel electrode 411, and an insulating film 434 is formed over the separation layer 171 (FIG. 26A). Specifically, the thin film transistor 422 is formed over the separation layer 171 with the insulating film 431 therebetween; the insulating film 433 is formed to cover the transistor 422; the wirings 405a and 405b, the pixel electrode 411, and a conductive film connected to an impurity region of the thin film transistor 422 are formed over the insulating film 433; and the insulating film 434 is formed to cover an end portion of the pixel electrode 411.

Subsequently, the element formation layer 445 is separated from the substrate 170. Here, after forming openings 446a to 446c by selectively irradiating the element formation layer 445 with laser light, the element formation layer 445 is separated from the substrate 170 using physical force. As another separation method, after exposing the separation layer 171 by forming the openings 446a to 446c by selectively removing the insulating films 431 to 434, the separation layer 171 is removed by introducing an etchant into the openings 446a to 446c (FIG. 26B). The separation layer 171 may be removed completely; however, the separation layer 171 is removed here so as to remain partially.

Subsequently, an adhesive film 177 is attached to a surface of the insulating film 434, and the element formation layer 445 is separated from the substrate 170 (FIG. 26C). Here, the substrate 170 is connected to the insulating film 431 of the element formation layer 445 with the separation layer which remains partially; therefore, the element formation layer 445 is separated from the substrate 170 using a physical means.

Figure 27A:
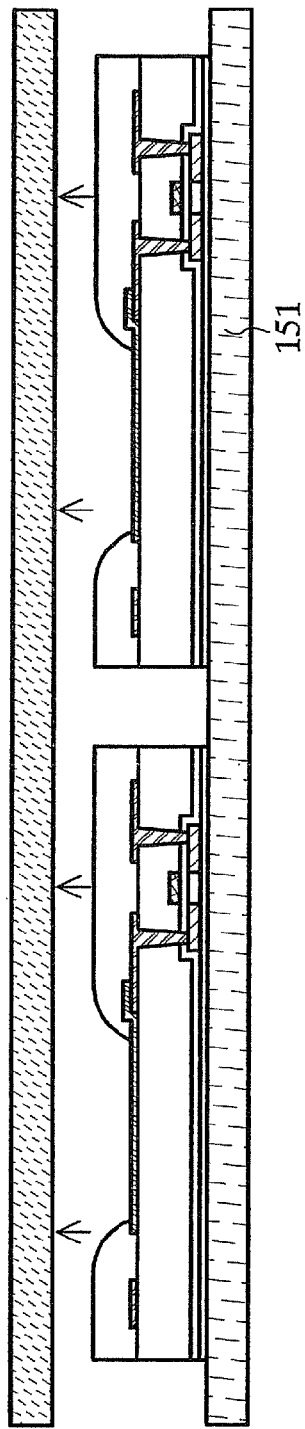
FIGS. 27A to 27C show an example of a method for manufacturing a semiconductor device of the present invention.

Subsequently, a surface of the element formation layer 445 on the side from which the substrate 170 is separated is attached to a film-like substrate 151 to separate the film 177 (FIG. 27A).

Figure 27B:
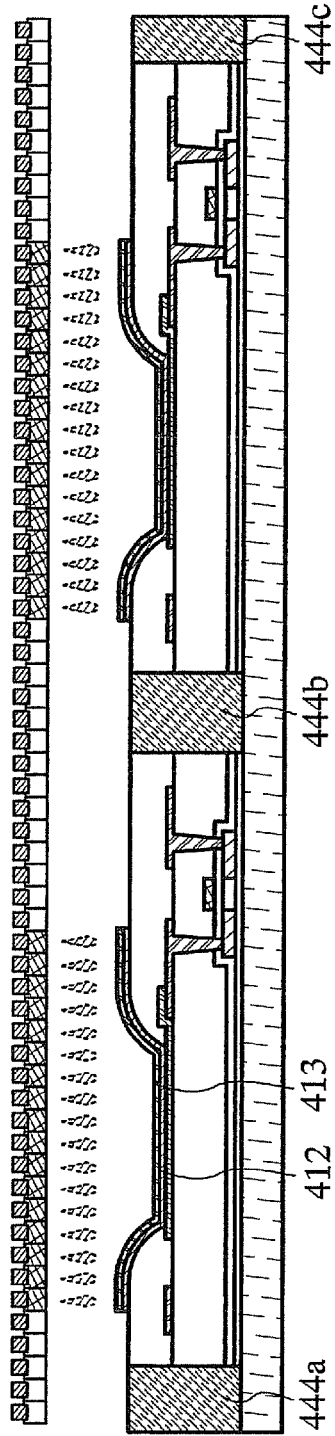

Subsequently, the light emitting layer 412, the opposite electrode 413, and bending materials 444a to 444c are selectively formed over the pixel electrode 411 (FIG. 27B). The light emitting layer 412 and the opposite electrode 413 may be formed either before or after forming the bending materials 444a to 444c. In addition, the openings 446a to 446c can be left as spaces without being provided with the bending materials 444a to 444c. The light emitting layer 412 and the opposite electrode 413 may be selectively formed using a droplet discharge method, or may be formed using a printing method such as a screen printing method or a gravure printing method. Here, the light emitting layer 412 and the opposite electrode 413 are selectively formed using a droplet discharge method. In the case of forming a display device which can perform color display, light emitting layers which emit light of three colors of R, G and B are each formed selectively. Since a wasted material can be reduced by thus forming the light emitting layer using a droplet discharge method or a printing method, cost can be reduced.

Figure 27C:
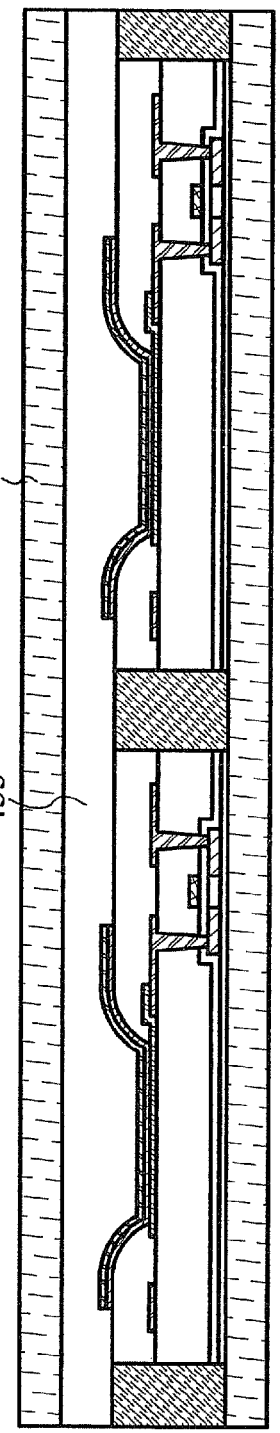

Subsequently, after forming the insulating film 435 to cover the opposite electrode 413, sealing is performed using the substrate 151 and a substrate 159 (FIG. 27C).

Through the above steps, a flexible display device can be formed. Note that the display device shown in FIG. 25A can be manufactured by forming the bending materials 444a to 444c after forming the insulating film 435 in FIG. 27C without forming the bending materials in FIG. 27B.

Note that the method in which an element formation layer is provided over a rigid substrate such as a glass substrate, and then the element formation layer is separated and provided over a flexible substrate is described here as a method for manufacturing a display device. However, the method for manufacturing a display device of the invention is not limited thereto. For example, after providing an element formation layer over a glass substrate or a semiconductor substrate of Si or the like, the glass substrate or the semiconductor substrate of Si or the like may be thinned by grinding treatment or polishing treatment. In this case, a flexible display device can be manufactured without performing separation.

Subsequently, applications of a display device which is manufactured using the above-described flexible semiconductor device are explained with reference to drawings.

Figure 28A:
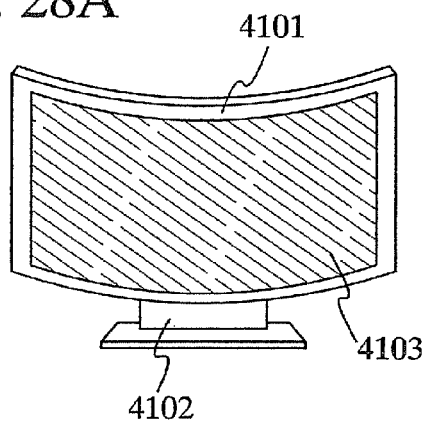
FIGS. 28A to 28F show examples of an application of a semiconductor device of the present invention.

FIG. 28A shows a display, which includes a main body 4101, a support 4102, a display portion 4103, and the like. The display portion 4103 is formed using a flexible substrate, which can realize a lightweight and thin display. In addition, the display portion 4103 can be curved, or can be detached from the support and hung on a wall. A flexible display can be manufactured by using the flexible semiconductor device described in this embodiment mode or the above embodiment mode for the display portion 4103, a circuit, or the like.

Figure 28B:
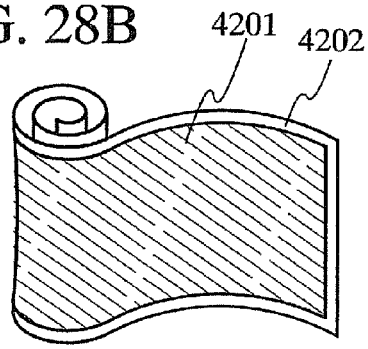

FIG. 28B shows a large-sized display that can be wound, which includes a main body 4201, a display portion 4202, and the like. Since the main body 4201 and the display portion 4202 are formed using a flexible substrate, the display can be carried in a bent or wound state. A flexible, lightweight, and thin large-sized display can be manufactured by using the flexible semiconductor device described in this embodiment mode or the above embodiment mode for the display portion 4202, a circuit, or the like.

Figure 28C:
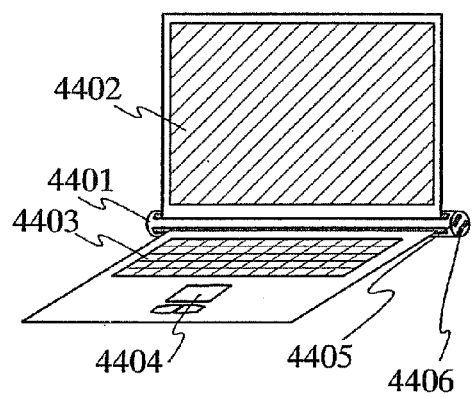

FIG. 28C shows a sheet-type computer, which includes a main body 4401, a display portion 4402, a keyboard 4403, a touch pad 4404, an external connection port 4405, a power plug 4406, and the like. The display portion 4402 is formed using a flexible substrate, which can realize a lightweight and thin computer. In addition, the display portion 4402 can be wound and stored if a portion of the power plug 4406 is provided with a storage space. A flexible, lightweight, and thin computer can be manufactured by using the flexible semiconductor device described in this embodiment mode or the above embodiment mode for the display portion 4402, a circuit, or the like.

Figure 28D:
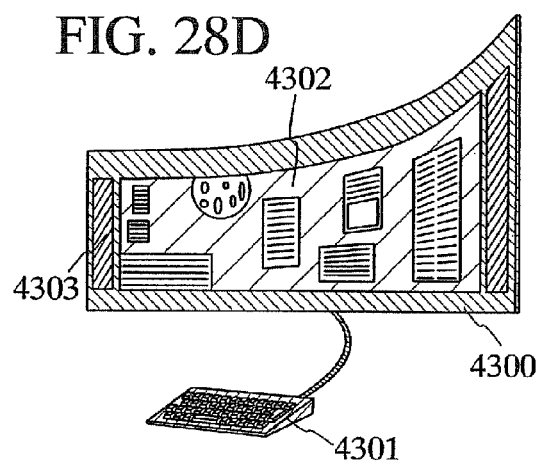

FIG. 28D shows a display device having a 20-inch to 80-inch large-sized display portion, which includes a main body 4300, a keyboard 4301 that is an operation portion, a display portion 4302, a speaker 4303, and the like. The display portion 4302 is formed using a flexible substrate, and the main body 4300 can be carried in a bent or wound state with the keyboard 4300 detached. A flexible, lightweight, and thin large-sized display device can be manufactured by using the flexible semiconductor device described in this embodiment mode or the above embodiment mode for the display portion 4302, a circuit, or the like.

Figure 28E:
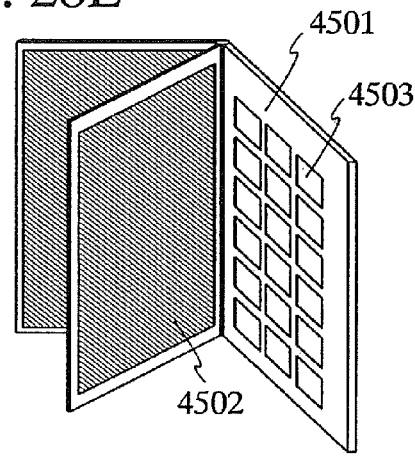

FIG. 28E shows an electronic book, which includes a main body 4501, a display portion 4502, an operation key 4503, and the like. In addition, a modem may be incorporated in the main body 4501. The display portion 4502 is formed using a flexible substrate and can be bent. Further, the display portion 4502 can display a moving image as well as a still image such as a character. A flexible, lightweight, and thin electronic book can be manufactured by using the flexible semiconductor device described in this embodiment mode or the above embodiment mode for the display portion 4502, a circuit, or the like.

Figure 28F:
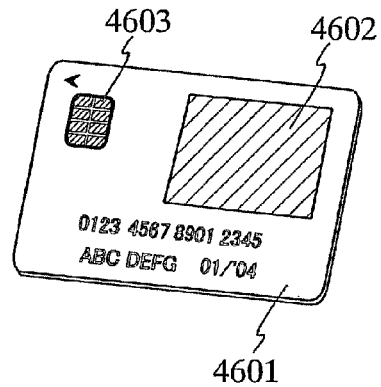

FIG. 28F shows an IC card, which includes a main body 4601, a display portion 4602, a connection terminal 4603, and the like. Since the display portion 4602 is formed to be a lightweight and thin sheet type using a flexible substrate, it can be formed over a card surface by attachment. When the IC card can receive data without contact, information obtained from outside can be displayed on the display portion 4602. A flexible, lightweight, and thin IC card can be manufactured by using the flexible semiconductor device described in this embodiment mode or the above embodiment mode for the display portion 4602, a circuit, or the like.

As described above, an applicable range of the invention is so wide that the invention can be applied to electronic devices or information display means of various fields. Note that this embodiment mode can be freely combined with the above embodiment mode.

What is claimed is:

1. A semiconductor device comprising:
   a flexible substrate;
   a transistor over the flexible substrate;
   a first insulating film having a first opening, over the transistor and the flexible substrate;
   a first conductive film over the first insulating film, electrically connected to the transistor; and
   a second insulating film having a second opening, over the first conductive film and the first insulating film; and
   a material in the first opening and the second opening,
   wherein the first opening overlaps with the second opening, and
   wherein the material is in contact with the first insulating film, the second insulating film and the flexible substrate.

2. The semiconductor device according to claim 1, wherein the material has a lower elastic modulus than that of the first and the second insulating films.

3. The semiconductor device according to claim 1, wherein the material has a lower glass transition point than that of the first and the second insulating films.

4. The semiconductor device according to claim 1, wherein the material has higher plasticity than that of the first and the second insulating films.

5. The semiconductor device according to claim 1, wherein the material is a metal having a high ductility and malleability property.

6. The semiconductor device according to claim 1, wherein the flexible substrate has an uneven pattern, and
   wherein the uneven pattern overlaps with the first opening.

7. A semiconductor device comprising:
   a flexible substrate;
   a transistor over the flexible substrate;
   a first insulating film having a first opening, over the transistor and the flexible substrate;
   a first conductive film over the first insulating film, electrically connected to the transistor; and
   a second insulating film having a second opening, over the first conductive film and the first insulating film;
   a second conductive film over the second insulating film;
   a third insulating film over the second conductive film; and
   a material in the first opening and the second opening,
   wherein the first opening overlaps with the second opening, and
   wherein the material is in contact with the first insulating film, the second insulating film and the flexible substrate.

8. The semiconductor device according to claim 7, wherein the second conductive film is an antenna.

9. The semiconductor device according to claim 7, wherein the third insulating film is flexible and is in contact with the flexible substrate.

10. The semiconductor device according to claim 7, wherein the material has a lower elastic modulus than that of the first and the second insulating films.

11. The semiconductor device according to claim 7, wherein the material has a lower glass transition point than that of the first and the second insulating films.

12. The semiconductor device according to claim 7, wherein the material has higher plasticity than that of the first and the second insulating films.

13. The semiconductor device according to claim 7, wherein the material is a metal having a high ductility and malleability property.

14. The semiconductor device according to claim 7, wherein the flexible substrate has an uneven pattern, and
   wherein the uneven pattern overlaps with the first opening.

15. A semiconductor device comprising a first pixel and a second pixel adjacent to the first pixel, the semiconductor device comprising:
   a flexible substrate;
   a first transistor for the first pixel;
   a second transistor for the second pixel;
   a first insulating film over the flexible substrate, the first transistor, and the second transistor, wherein the first insulating film has a first opening between the first pixel and the second pixel;
   a first conductive film for the first pixel, the first conductive film electrically connected to the first transistor;
   a second conductive film for the second pixel, the second conductive film electrically connected to the second transistor;
   a second insulating film over the first insulating film, the first conductive film and the second conductive film, wherein the second insulating film has a second opening between the first pixel and the second pixel;
   a third conductive film for the first pixel, wherein the third conductive film is over the second insulating film and electrically connected to the first conductive film;
   a fourth conductive film for the second pixel, wherein the fourth conductive film is over the second insulating film and electrically connected to the second conductive film; and
   a material in the first opening and the second opening,
   wherein the first opening overlaps with the second opening, and
   wherein the material is in contact with the first insulating film, the second insulating film and the flexible substrate.

16. The semiconductor device according to claim 15, wherein the material has a lower elastic modulus than that of the first and the second insulating films.

17. The semiconductor device according to claim 15, wherein the material has a lower glass transition point than that of the first and the second insulating films.

18. The semiconductor device according to claim 15, wherein the material has higher plasticity than that of the first and the second insulating films.

19. The semiconductor device according to claim 15, wherein the material is a metal having a high ductility and malleability property.

20. The semiconductor device according to claim 15, wherein the flexible substrate has an uneven pattern, and
   wherein the uneven pattern overlaps with the first opening.

* * * * *